US006404698B1

(12) United States Patent
Inaba et al.

(10) Patent No.: US 6,404,698 B1
(45) Date of Patent: Jun. 11, 2002

(54) SEMICONDUCTOR MEMORY DEVICE HAVING COLUMN REDUNDANCY FUNCTION

(75) Inventors: Tsuneo Inaba; Shinichiro Shiratake, both of Yokohama; Kenji Tsuchida, Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/496,032

(22) Filed: Jan. 21, 2000

Related U.S. Application Data

(62) Division of application No. 09/179,893, filed on Oct. 28, 1998, now Pat. No. 6,034,914.

(30) Foreign Application Priority Data

Oct. 30, 1997 (JP) .............................................. 9-298747

(51) Int. Cl.⁷ ................................................ G11C 8/00
(52) U.S. Cl. .............................. 365/230.06; 365/230.03
(58) Field of Search ....................... 365/230.06, 230.03, 365/230.05, 200, 201

(56) References Cited

U.S. PATENT DOCUMENTS

| 5,289,413 A |   | 2/1994  | Tsuchida et al. ........ 365/189.02 |
| 5,416,741 A | * | 5/1995  | Oshawa ...................... 365/201 |
| 5,497,352 A |   | 3/1996  | Magome ................. 365/230.03 |
| 5,502,675 A | * | 3/1996  | Kohno et al. ................ 365/200 |
| 5,566,128 A |   | 10/1996 | Magome ................. 365/230.06 |

FOREIGN PATENT DOCUMENTS

JP          5-54691          3/1993

* cited by examiner

Primary Examiner—Amir Zarabian
Assistant Examiner—Anh Phung
(74) Attorney, Agent, or Firm—Banner & Witcoff, Ltd.

(57) ABSTRACT

There is provided a semiconductor memory device which comprises a plurality of memory cells, a plurality of bit lines connected with the plurality of memory cells, a plurality of word lines connected with the plurality of memory cells, a plurality of data line pairs, a plurality of transfer gates for effecting controlled connection of the plurality of bit lines with the plurality of data lines, a plurality of column select lines for controlling conductibility of the plurality of the transfer gates, and a column select line drive circuit for simultaneously selecting and driving at least two of the plurality of column select lines corresponding to one-time column address input from the outside of the chip.

15 Claims, 13 Drawing Sheets

US 6,404,698 B1

SEMICONDUCTOR MEMORY DEVICE HAVING COLUMN REDUNDANCY FUNCTION

This application is a division of U.S. Ser. No. 09/179,893, filed Oct. 28, 1998, now U.S. Pat. No. 6,034,914 issued Mar. 7, 2000.

BACKGROUND OF THE INVENTION

The present invention relates to a dynamic semiconductor memory device (DRAM) and particularly, to a semiconductor memory device having a so-called column redundancy function that a defective memory cell is replaced with a spare memory cell on a column by column basis.

A DRAM which is used as a main memory device generally for a personal computer (PC), a work station and the like has experienced capacity increase by quadrupling in each generation. As a result, a DRAM having a capacity of as large as one giga bits has been realized, though in a prototype stage or in a stage of presentation in an institute conference. In such a large capacity DRAM chip, it can be said that there is almost no opportunity that all the memory cells can orderly work. For that reason, there is an unavoidable requirement for a so-called redundancy technique in which a defective memory cell is replaced with a spare memory cell.

Production yield of DRAMs can be improved more as the number of spare memory cells is larger. It is natural, however, that a chip size is increased and cost is also higher. For that reason, there becomes important increase in an efficiency of application of the redundancy technique, that is to realize a highest production yield with use of as small a number of spare memory cells as possible.

The redundancy technique is divided, in a broad sense, into two categories in terms of a method of replacement of a defective memory cell, one of which is a row redundancy technique in which replacement is performed on a word line by word line basis and the other of which is a column redundancy technique in which replacement is performed on a column select line by column select line basis.

At this point, attention will be given to a column redundancy technique. Generally in a column redundancy technique, a defective memory cell is replaced with a spare memory cell with one CSL as a unit.

The number of bit lines selected by one CSL is usually equal to the number of data input/output lines (DQ lines). For this reason, a minimal replacement unit of a column redundancy technique is equal to the number of DQ lines.

Then, consideration will be given to the number of DQ lines. Demands for realization of a DRAM of a higher speed has been present and it is generally said that an access speed of the order of 50 ns to 60 ns is the limit based on the current state of technology. Therefore, there has been used a so-called multiple bit chip provided with many data I/O pins, whereby a band width for data transfer is improved. To increase the number of data I/O pins requires to broaden a bus width inside the DRAM. In addition, to broaden the bus width requires to increase the number of DQ lines.

This has, however, a meaning that a minimal replacement unit of a column redundancy technique is enlarged. As a result, there has remained a problem that a remedy efficiency in a column redundancy technique is decreased.

In such a situation, there has been developed a column redundancy technique whereby a remedy efficiency of a defect product is improved without increase of the number of spare memory cells. FIGS. 1A and 1B show examples of the technique. This technique has been disclosed in Jpn. Pat. Appln. Publication No. 5-54691, which will be described below.

FIG. 1A shows a structure of a main part memory cell array of a DRAM and its peripheral circuits described in the publication. Like this, FIG. 1B shows a structure of a spare memory cell array and its peripheral circuits.

In FIG. 1A, MC11, MC12, MC21 and MC22 are memory cells respectively; WL1 and WL2 are word lines respectively; BL1 and /BL1, BL2 and /BL2 are bit line pairs respectively; SA1 and SA2 are sense amplifiers respectively connected to the two pairs of bit lines BL1 and /BL1, BL2 and /BL2 and sense data read out on the bit lines; DQ0 and /DQ0, DQ1 and /DQ1 are DQ line pairs; and Q11, Q12, Q21 and Q22 are transfer gates for effecting controlled connection of the bit line pairs BL1 and /BL1, BL2 and /BL2 after data are sensed by the two sense amplifiers SA1 and SA2 with the two DQ line pairs DQ0 and /DQ0, DQ1 and /DQ1.

All gates of the four transfer gates Q11, Q12, Q21 and Q22 are commonly connected to one column select line SCL1.

In FIG. 1B, MCR11 and MCR12 are spare memory cells respectively; BLR1 and /BLR1 are spare bit line pairs; SAR1 is a sense amplifier which is connected to the spare bit line pair BLR1, /BLR1 and senses data read out on the spare bit line pairs; QR11, QR12, QR21 and QR22 are transfer gates for effecting controlled connection of the spare bit line pair BLR1, /BLR1 after data is sensed by the sense amplifier SAR1 with the two DQ line pairs DQ0, /DQ0, DQ1, /DQ1.

Gates of two transistor gates QR11, QR12 of the four transfer gates in FIG. 1B are commonly connected to a spare column select line CSLR1 and gates of the residual two transfer gates QR21, QR22 are commonly connected with a spare column select line CSLR2.

In such structures, when one of two word lines WL1 and WL2 is selected by a row decoder (not shown), data stored in memory cells that are connected to an activated word line are read out to bit lines. For example, when word line WL1 is selected, data stored in memory cells MC11 and MC21 are read out to bit lines BL1 and BL2. Thereafter, the sense amplifiers SA1 and SA2 are activated, thereby sensing the data stored in the memory cells.

After the sense amplifiers SA1, SA2 are activated, sensed data on one bit line pair BL1, /BL1 are transferred to the one DQ line pair DQ0, /DQ0 through the transfer gates Q11, Q12. Sensed data on the other bit line pair BL2, /BL2 are transferred to the other DQ line pair DQ1, /DQ1 through the transfer gates QR21, QR22.

At this point, when a defective memory cell is present in the memory cell array, the spare memory cells MCR11, MCR12 in the spare memory cell array are used instead of the defective memory cell. In other words, when one or both of the memory cells MC11, MC12 are defective and both memory cells MC11, MC12 are externally tried to be accessed, the spare column select line CSLR1 is driven by a redundancy control circuit, not shown, and the transfer gates QR11, QR12 are both conductive. Thereby, the spare bit line pair BLR1, /BLR1 are connected with the DQ line pair DQ0, /DQ0 through the two transfer gates QR11, QR12. As a result, data is read or written on the spare memory cells MCR11, MCR12 instead of the memory cells MC11, MC12.

On the other hand, when one or both of the memory cells MC21, MC22 are defective, the spare column select line CSLR2 is driven and the two transfer gates QR21, QR22 are both conductive. The spare bit line pairs BLR1, /BLR1 are connected with the DQ line pair DQ1, /DQ1 through the two transfer gates QR21, QR22 and data are read or written on the spare memory cells MCR11, MCR12 instead of the memory cells MC21, MC22.

In a conventional DRAM shown in FIGS. 1A and 1B, all the four transfer gates Q11, Q12, Q21, Q22 in the memory cell array are controlled by a signal of one column select line CSL1. In general, according to the column redundancy technology, defective columns are replaced in units of the number of columns corresponding to one column select line. If one or more of MC11, MC12, MC21 and MC22 are defective, all bit line pairs that are connected to column select line CSL1 are replaced with spare columns shown in FIG. 1B. In this example, two spare columns shown in FIG. 1B are needed for the replacement of CSL1. In an ordinary replacement method, the first one of the spare columns is connected to a DQ line pair made up of DQ0 and /DQ0, and the second one is connected to a DQ line pair made up of DQ1 and /DQ1.

In the conventional technology, the bit line pairs BLR1 and /BLR1 of spare columns are connectable to either one of DQ line pairs. In spite of this configuration, the remedy efficiency is hardly enhanced, in comparison with the remedy efficiency in another configuration.

BRIEF SUMMARY OF THE INVENTION

The present invention has been made in consideration of the above described circumstances and it is, accordingly, an object of the present invention to provide a semiconductor memory device in which not only is improvement of a remedy efficiency of a defective product achieved without increase in the number of spare memory cells.

According to the present invention, there is provided a semiconductor memory device which comprises: a plurality of memory cells; a plurality of bit lines connected with the plurality of memory cells; a plurality of word lines connected with the plurality of memory cells; a plurality of data lines; a plurality of transfer gates for effecting controlled connection of the plurality of bit lines with the plurality of data lines; a plurality of column select lines for controlling conductibility of the plurality of the transfer gates; and a column select line drive circuit for simultaneously selecting and driving at least two of the plurality of column select lines corresponding to one-time column address input from the outside of the chip.

According to the present invention, there is provided a semiconductor memory device which comprises: a plurality of memory cells; a plurality of bit line pairs connected to the plurality of memory cells; a plurality of word line pairs connected to the plurality of memory cells; a plurality of data line pairs; a plurality of transfer gates connected to between the plurality of bit lines pairs and the plurality of data lines pairs; a first column select line for controlling conductibility of the plurality of first transfer gates connected to one half of the plurality of data line pairs; a second column select line for controlling conductibility of the plurality of second transfer gates connected to the other half of the plurality of data line pairs; a column select line drive circuit for simultaneously selecting and driving the first and second column select lines corresponding to one-time column address input from the outside of the chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Below described will be the present invention based on embodiments thereof in reference to the drawings.

Figure 1A:
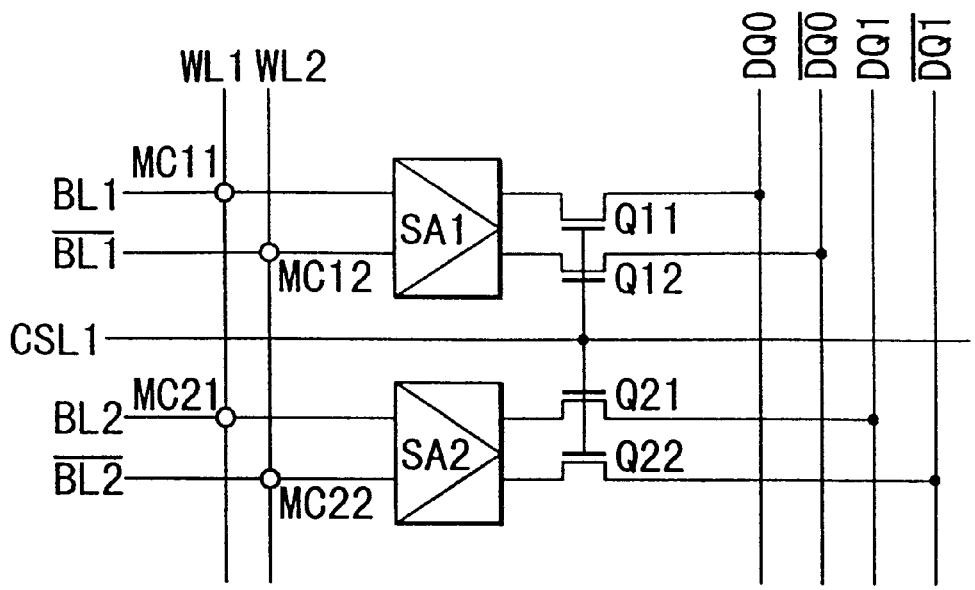
FIGS. 1A and 1B are circuit diagrams showing not only a memory cell array of a conventional DRAM and its peripheral circuits but a spare memory cell array and its peripheral circuits.
Figure 1B:
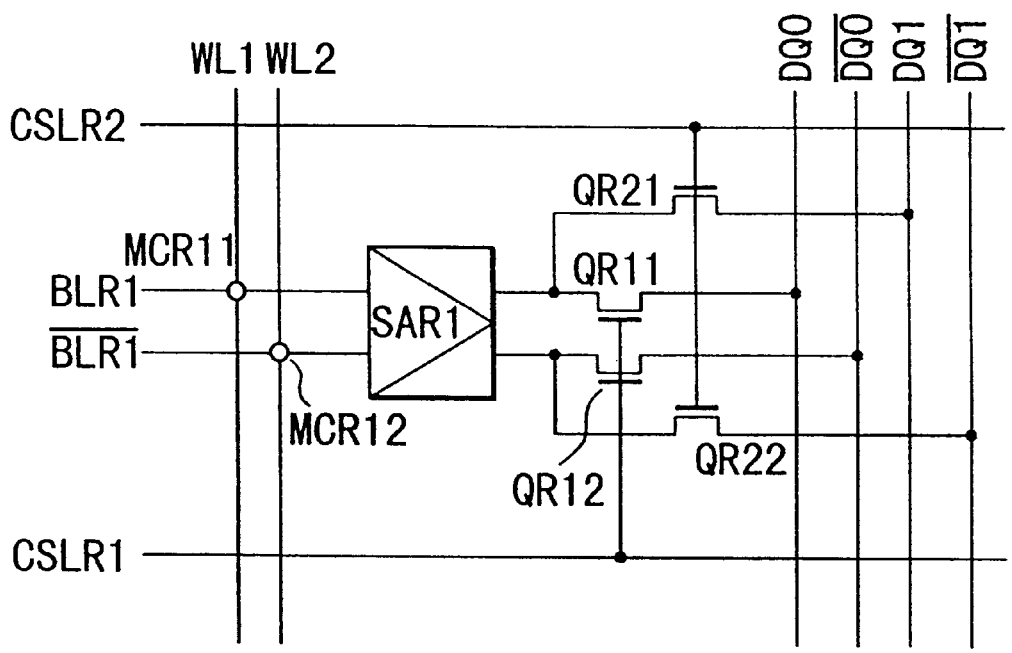
Figure 2:
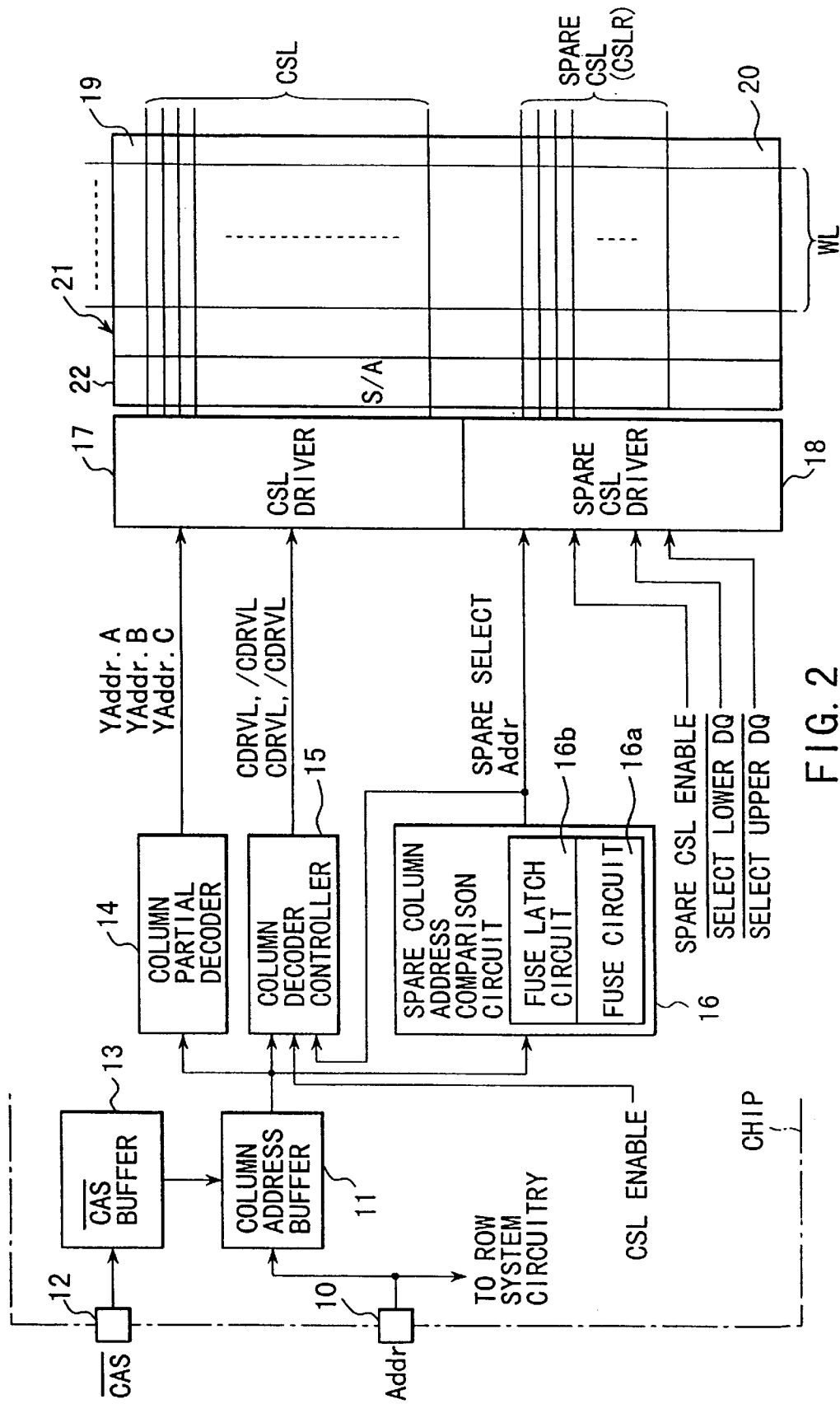
FIG. 2 is a block diagram schematically showing an internal structure of part of a DRAM pertaining to the present invention.

FIG. 2 is a block diagram schematically showing an internal structure of part of the DRAM pertaining to the present invention. A DRAM chip comprises: an address input pin 10; a column address buffer 11, a column address strobe (CAS) signal input pin 12; a /CAS buffer 13; a column partial decoder 14; a column decoder controller 15; a spare column address comparison circuit 16; a CSL driver group 17; a spare CSL driver group 18; a memory cell array 21 composed of a memory cell array 19 and a spare memory cell array 20; and a sense amplifiers (S/A) 22 and the like.

In addition, a plurality of word lines WL are provided so as to traverse the memory cell array 19 and the spare memory cell array 20 in a continuous manner. A plurality of column select lines CSL are provided so as to traverse the memory cell array 19 thereon in a direction intersecting the word lines WL. A plurality of spare column select lines CSLR (spare column CSL) are provided in a direction parallel to the plurality of column select lines CSL on the spare memory cell array 20.

A plurality of bit line pairs and a plurality of spare bit line pairs, both of which are not shown in the figure, are respectively provided for the memory cell array 19 and the spare memory cell array 20.

An address signal Addr is input to the address input pin 10 from the outside of the chip. While only one address input pin 10 is shown for convenience, the pins are provided in number in a corresponding manner to the number of bits of an address signal Addr since the address signal Addr comprises a plurality of bits.

A row address signal input from the address input pin 10 is supplied to a row system circuitry, not shown. A column address signal input from the address input pin 10 is supplied to the column address buffer 11.

A column address strobe signal /CAS is supplied to the signal input pin 12 from the outside of the chip. The column address strobe signal /CAS is supplied to the /CAS buffer 13. The /CAS buffer 13 outputs a latch signal by receiving the column address strobe signal /CAS. The latch signal is supplied to the column address buffer 11. When the column address buffer 11 receives the latch signal, the column address buffer 11 latches a column address signal and outputs an internal column address signal. The internal column address signal is supplied to the column partial decoder 14, the column decoder controller 15 and the spare column address comparison circuit 16.

The column partial decoder 14 receives an internal column address signal and outputs three kinds of signals: column address signals YAddr. A, YAddr. B, YAddr. C to the CSL driver 17. Here, for example, YAddr. A and YAddr. B are signals of the same (N+1) bits and YAddr. C is a signal of (M+1) bits. The numbers of bits of the address signals are not restricted to the values shown above.

The column partial decoder 14 described above outputs three kinds of column address signals, namely, YAddr. A, YAddr. B and YAddr. C. However, this in no way restricts the number of column address signals output from the column partial decoder 14.

The spare column address comparison circuit 16 comprises a fuse circuit 16a provided with a plurality of fuses and a fuse latch circuit 16b which latches a signal corresponding to a connect or disconnect state of each of the plurality of fuses provided in the fuse circuit 16a. A defective column address is programmed in the spare column address comparison circuit 16 by selectively melting to disconnect a fuse in the fuse circuit 16a. An internal column address signal output from the column address buffer 11 is compared with a defective column address programmed in advance when data is accessed in the spare column address comparison circuit 16 and when both addresses coincide with each other, the defective column address signal "Spare Select Addr." is output. The defective column address signal "Spare Select Addr." is supplied to the column decoder controller 15 and the spare CSL driver group 18.

The column decoder controller 15 outputs two sets of control signals CDRVL, /CDRVL, CDRVU, /CDRVU according to an internal column address signal, a defective column address signal "Spare Select Addr." and a CSL enable signal CSL Enable. The control signals CDRVL, /CDRVL, CDRVU, /CDRVU are supplied to the CSL driver group 17.

The CSL driver group 17 selectively drives the plurality of column select lines CSL according to the three kinds of signals: column address signals YAddr. A, YAddr. B, YAddr. C and the two sets of control signals CDRVL, /CDRVL, CDRVU, /CDRVU. At this time, the CSL driver group 17 is structured so as to select and drive plural ones among the plurality of column selection lines CSL, for example two column lines CSL at the same time according to one-time input of an internal column address signal.

Supplied to the spare CSL drivers 18 are a spare CSL enable signal "Spare CSL Enable", a control signal "/Select Lower DQ" for selecting a lower order bit side of a DQ line described later and a control signal "/Select Upper DQ" for selecting an upper order bit side in addition to the defective column address signal "Spare Select Addr". The spare CSL enable signal "Spare CSL Enable" is a signal which is placed at a high level when a spare column select line CSLR is selected and driven in the spare CSL driver group 18 and generated in a circuit, not shown. The control signals "/Select Lower DQ", "/Select Upper DQ" are signals which defines which of the DQ line pairs a spare column to be selected is connected with and, for example, signals of specific bits among the column address signals can be used as both signals.

The spare CSL driver group 18 select and drive the spare column select line or the plurality of spare column select lines CSLR according to these signals.

Figure 3A:
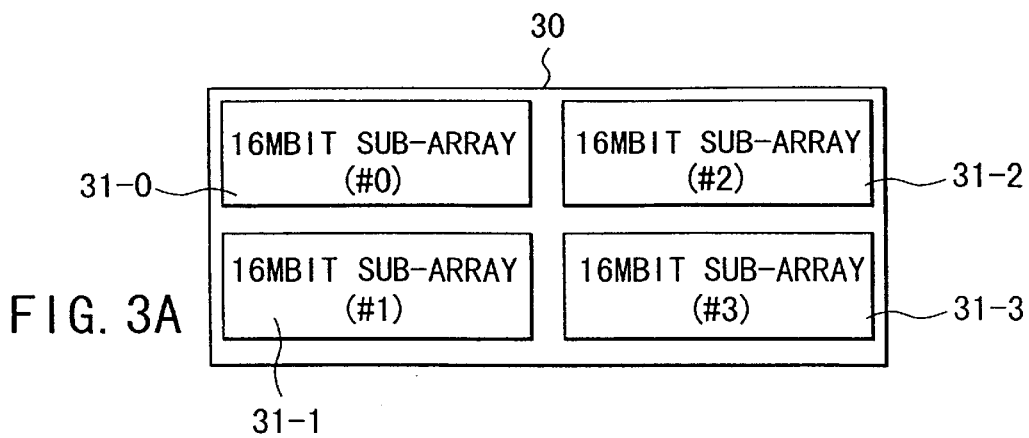
FIGS. 3A to 3C are diagrams showing pattern layouts of the whole of the DRAM chip and parts thereof shown in FIG. 2.

FIG. 3A is a diagram showing a pattern layout of the whole of the DRAM chip of FIG. 2. This example is the case of a DRAM chip 30 having a memory capacity of 64 Mbit and the chip 30 is provided with four 16 Mbit sub-arrays 31-0 to 31-3 each having 16 Mbit memory cells.

Figure 3B:
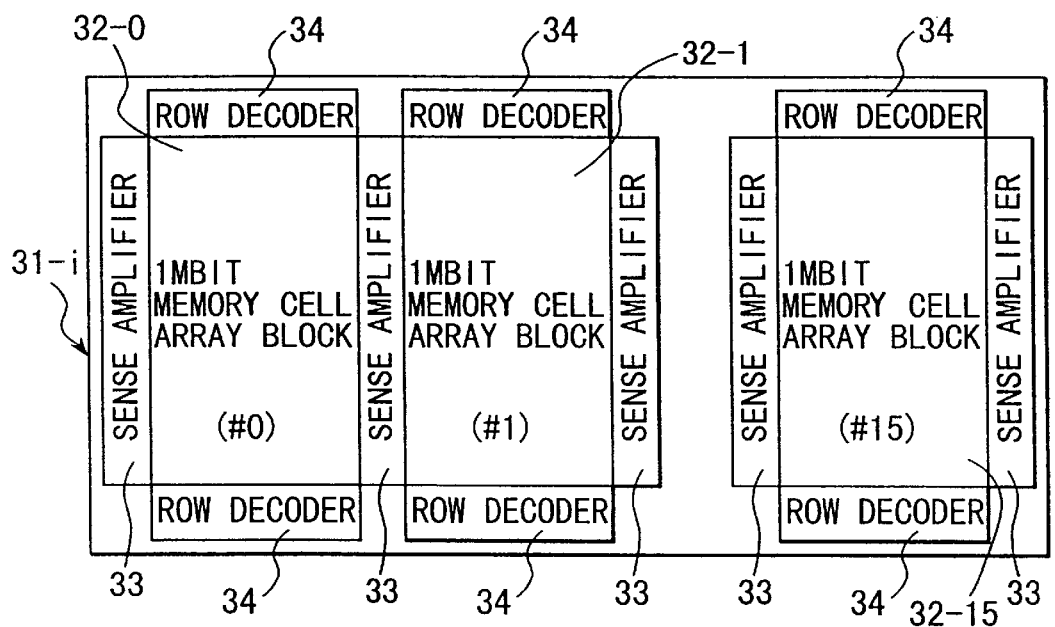

FIG. 3B shows a pattern layout of one sub-array 31-i (i=0 to 3) in FIG. 3A. Each sub-array 31-i is provided with sixteen 1 Mbit memory cell array blocks 32-0 to 32-15 each of which has 1 Mbit memory cells, a plurality of sense amplifiers 33 and a plurality of row decoders 34.

Figure 3C:
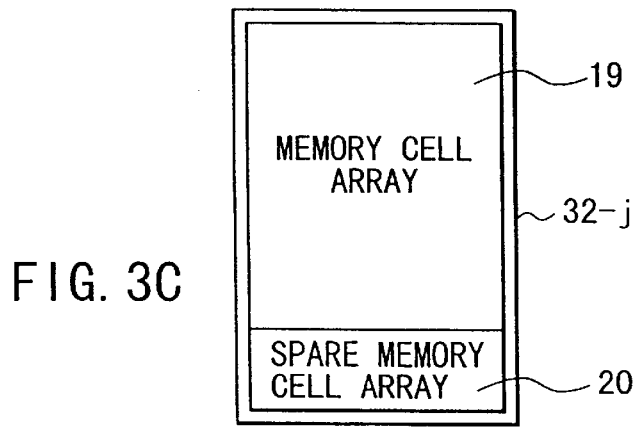

FIG. 3C shows a pattern layout of one memory cell array block 32-i (i=0 to 15) in FIG. 3B. The memory cell array block 32-j is provided with part of the memory cell array 19 and part of the spare memory cell array 20. That is, memory cells in the memory cell array 19 are divided into 64 memory cell array blocks each having memory cells the number of which is $\frac{1}{2}^6$ ($\frac{1}{64}$) times the total number of memory cells of the memory cell array and a spare memory cell described above is provided for each memory cell array block.

Figure 4:
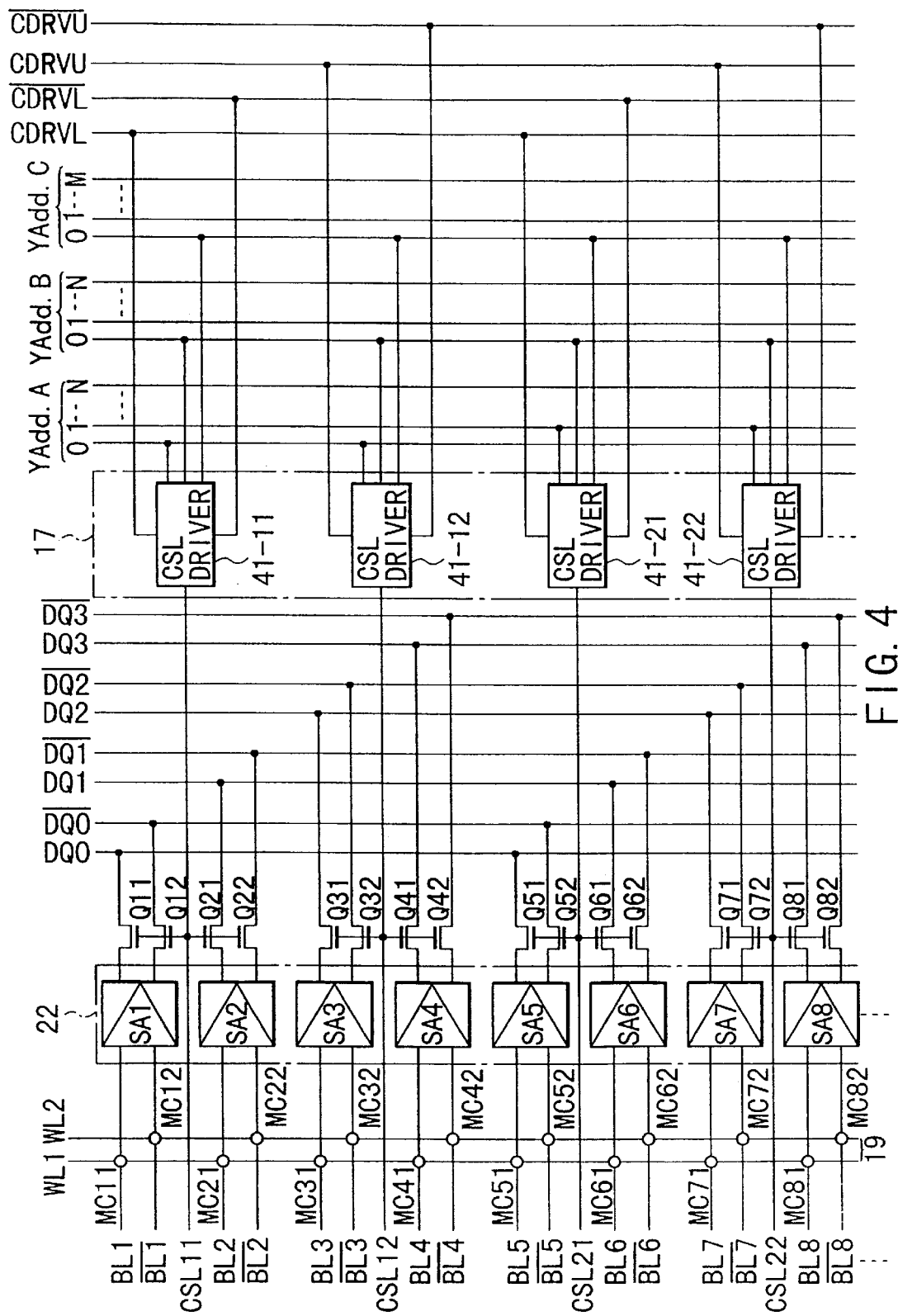
FIG. 4 is a circuit diagram showing a concrete structure of a memory cell array of the DRAM and its peripheral circuits, shown in FIG. 2.
Figure 5:
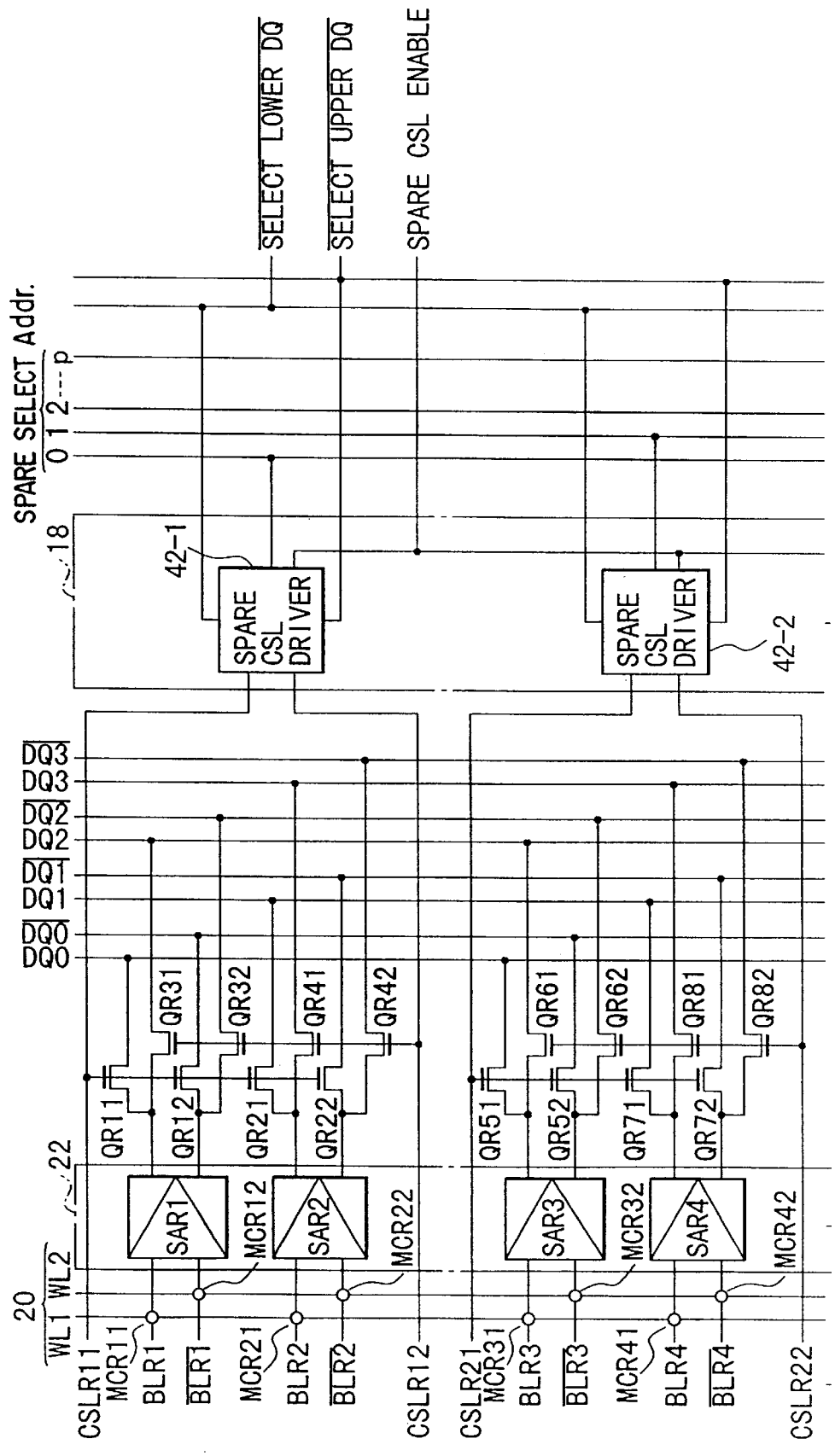
FIG. 5 is a circuit diagram showing a concrete structure of a spare memory cell array of the DRAM and its peripheral circuits, shown in FIG. 2.

FIG. 4 is a circuit diagram showing a concrete circuit structure of the memory cell array 19 of the DRAM and its peripheral circuits and FIG. 5 is a circuit diagram showing a concrete circuit structure of the spare memory cell array 20 of the DRAM and its peripheral circuits, shown in FIG. 2.

In FIG. 4, MC11, MC12, MC21, MC22, MC31, MC32, MC41, MC42, MC51, MC52, MC61, MC62, MC71, MC72, MC81, MC82 . . . are memory cells respectively; WL1, WL2, . . . are word lines respectively; BL1, /BL1, . . . BL8, /BL8 . . . are bit line pairs respectively; SA1 . . . SA4 are sense amplifiers for sensing data read out on the bit lines, the sense amplifiers being provided in the sense amplifier group 22 and respectively connected to the bit line pairs BL1, /BL1, . . . BL8, /BL8 . . . ; DQ0, /DQ0 to DQ3, /DQ3 are DQ line pairs; Q11, Q12, Q21, Q22, Q31, Q32, Q41, Q42, Q51, Q52, Q61, Q62, Q71, Q72, Q81, Q82 . . . are transfer gates for effecting controlled connection of the bit line pairs BL1, /BL1, . . . BL8, /BL8 . . . after data are sensed by the sense amplifiers SA1 . . . SA8 with the four DQ line pairs DQ0, /DQ0 to DQ3, /DQ3 in combinations; and CSL11, CSL12, CSL21, CSL22 . . . are column select lines selectively driven by outputs of the CSL driver group 17.

In the CSL driver group 17, a plurality of CSL drivers 41-11, 41-12, 41-21, 41-22 . . . are provided.

Supplied to the SCL driver 41-11 are a signal of the 0 marked bit of a column address signal YAddr. A having the (N+1) bits, a signal of the 0 marked bit of a column address signal YAddr. B having the (N+1) bits, a signal of the 0 marked bit of a column address signal YAddr. C having the (M+1) bits and control signals CDRVL, /CDRVL.

Supplied to the CSL driver 41-12 are a signal of the 0 marked bit of a column address signal YAddr. A having the (N+1) bits, a signal of the 0 marked bit of a column address signal YAddr. B having the (N+1) bits, a signal of the 0 marked bit of a column address signal YAddr. C having the (M+1) bits and control signals CDRVU, /CDRVU. That is, supplied to this CSL driver 41-12 are the same column address signals as those supplied-to the CSL driver 41-11. However, kinds of control signals CBRV, /CDRV are different from the case of the CSL driver 41-11.

Supplied to the CSL driver 41-21 are a signal of the 1 marked bit of a column address signal YAddr. A having the (N+1) bits, a signal of the 0 marked bit of a column address signal YAddr. B having the (N+1) bits, a signal of the 0 marked bit of a column address signal YAddr. C having the (M+1) bits and control signals CDRVL, /CDRVL.

Supplied to the CSL driver 41-22 are a signal of the 1 marked bit of a column address signal YAddr. A having the (N+1) bits, a signal of the 0 marked bit of a column address signal YAddr. B having the (N+1) bits, a signal of the 0 marked bit of a column address signal YAddr. C having the (M+1) bits; and control signals CDRVU, /CDRVU. That is, supplied to this CSL driver 41-12 are the same column addresses. That is, supplied to this CSL driver 41-22 are the same column address signals as those supplied to the CSL driver 41-21. However, kinds of control signals CDRV, /CDRV are different from the case of the CSL driver 41-21.

Each CSL driver decodes a column address signal when a control signal CDRVL or CDRVU is at an H level and /CDRVL or /CDRVU is at a L level and drives a corresponding column select line CSL by the decoded output. The levels of the control signals CDRVL, /CDRVL and CDRVU, /CDRVU are determined on the basis of a column address which is input to the column decoder controller 15 shown in FIG. 2 and a spare select address signal "Spare Select Addr." which is output from the spare column address comparison circuit 16 shown in FIG. 2.

The four transfer gates Q11, Q12, Q21, Q22 are respectively connected to between two pairs of bit lines BL1, /BL1; BL2, /BL2 and two pairs of DQ lines DQ0, /DQ0; DQ1, /DQ1. Gates of the four transfer gates Q11, Q12, Q21, Q22 are further connected to a column select line CSL11 in common.

The four transfer gates Q31, Q32, Q41, Q42 are respectively connected to between two pairs of bit lines BL3, /BL3; BL4, /BL4 and two pairs of DQ lines DQ2, /DQ2; DQ3, /DQ3. Gates of the four transfer gates Q31, Q32, Q41, Q42 are further connected to a column select line CSL12 in common.

The four transfer gates Q51, Q52, Q61, Q62 are respectively connected to between two pairs of bit lines BL5, /BL5; BL6, /BL6 and two pairs of DQ lines DQ0, /DQ0; DQ1, /DQ1. Gates of the four transfer gates Q51, Q52, Q61, Q62 are further connected to a column select line CSL21 in common.

The four transfer gates Q71, Q72, QB1, Q82 are respectively connected between two pairs of bit lines BL7, /BL7; BLB, /BL8 and two pairs of DQ lines DQ2, /DQ2; DQ3, /DQ3. Gates of the four transfer gates Q71, Q72, QB1, Q82 are further connected to a column select line CSL22 in common.

In FIG. 5, MCR11, MCR12, MCR21, MCR22, MCR31, MCR32, MCR41, MCR42 . . . are spare memory cells respectively; BLR1, /BLR1, BLR2, /BLR2, BLR3, /BLR3, BLR4, /BLR4, . . . are spare bit line pairs respectively; SAR1, SAR2, SAR3, SRA4 are sense amplifiers for sensing data read out on the spare bit lines, the sense amplifiers being respectively connected to the spare bit line pairs BLR1, /BLR1, BLR2, /BLR2, BLR3, /BLR3, BLR4, /BLR4, . . . ; QR11, QR12, QR21, QR22, QR31, QR32, QR41, QR42, QR51, QR52, QR61, QR62, QR71, QR72, QR81, QR82 . . . are transfer gates for effecting controlled connection of the spare bit line pairs BLR1, /BLR1, BLR2, /BLR2, BLR3, /BLR3, BLR4, /BLR4, . . . after data are sensed by the sense amplifiers SAR1 . . . SAR4 . . . with the four DQ line pairs DQ0, /DQ0 to DQ3, /DQ3; and CSLR11, CSLR12, CSLR21, CSLR22 . . . are spare column select lines selectively driven by outputs of the spare SCL driver group 18.

In the spare CSL driver group 18, spare CSL drivers 42-1, 42-2, . . . are provided. Each of the spare CSL drivers has two output nodes.

Supplied to the spare CSL driver 42-1 are a signal of the 0 marked bit of a defective column address signal "Spare Select Addr." having (P+1) bits, a spare CSL enable signal "Spare CSL Enable", a control signal "/Select Lower DQ" for selecting a lower order side DQ line and a control signal "/Select Upper DQ" for selecting an upper order side DQ line. The spare column select line CSLR11 is connected with one of the output nodes of the spare CSL driver 42-1 and the spare column select line CSLR12 is connected with the other node thereof.

Supplied to the spare CSL driver 42-12 are a signal of the 1 marked bit of the defective column address signal "Spare Select Addr.", a spare CSL enable signal "Spare SCL Enable", a control signal "/Select Lower DQ" for selecting a lower order side DQ line and a control signal "/Select Upper DQ" for selecting an upper order side DQ line. The spare column select line CSLR21 is connected with one of the output nodes of the spare CSL driver 42-2 and the spare column select line CSLR22 is connected with the other node thereof.

The two transfer gates QR11, QR12 are respectively connected to between the spare bit lines BLR1, /BLR1 and the DQ line pair DQ0, /DQ0. Gates of the two transfer gates QR11, Q12 are further connected to the spare column select line CSLR11 in common.

The two transfer gates QR31, QR32 are respectively connected to between the spare bit lines BLR1, /BLR1 and the DQ line pair DQ2, /DQ2. Gates of the two transfer gates QR31, Q32 are further connected to the column select line CSLR12 in common.

The two transfer gates QR21, QR22 are respectively connected to between the spare bit lines BLR2, /BLR2 and the DQ line pair DQ1, /DQ1. Gates of the two transfer gates QR21, Q22 are further connected to the spare column select line CSLR11 in common.

The two transfer gates QR41, QR42 are respectively connected to between the spare bit lines BLR2, /BLR2 and the DQ line pair DQ3, /DQ3. Gates of the two transfer gates QR41, Q42 are further connected to the spare column select line CSLR12 in common.

The two transfer gates QR51, QR52 are respectively connected to between the spare bit lines BLR3, /BLR3 and the DQ line pair DQ0, /DQ0. Gates of the two transfer gates QR51, Q52 are further connected to the spare column select line CSLR21 in common.

The two transfer gates QR61, QR62 are respectively connected to between the spare bit lines BLR3, /BLR3 and the DQ line pair DQ2, /DQ2. Gates of the two transfer gates QR61, Q62 are further connected to the spare column select line CSLR21 in common.

The two transfer gates QR71, QR72 are respectively connected to between the spare bit lines BLR4, /BLR4 and the DQ line pair DQ1, /DQ1. Gates of the two transfer gates QR71, Q72 are further connected to the spare column select line CSLR21 in common.

The two transfer gates QR81, QR82 are respectively connected to between the spare bit lines BLR4, /BLR4 and the DQ line pair DQ3, /DQ3. Gates of the two transfer gates QR81, Q82 are further connected to the spare column select line CSLR22 in common.

In such a structure, when a defective memory cell is not present in the memory cell array 19, that is when a defective column address is not programmed in the spare column address comparison circuit 16, input from the outside of the chip are a row address signal corresponding to the word line WL1 and a column address signal corresponding to a column select lines CSL11 and CSL12 (one column address). At this time, the word line WL1 is driven by output of a row decoder, not shown. A column decoder controller 15 sets control signals CDRVL, CDRVU both at an H level and control signals /CDRVL, /CDRVU both at a L level. Thereby, two CSL drivers 41-11, 41-21 in the CSL driver group 17 are operated and the column select lines CSL11, CSL12 are selected and driven at the same time.

With the word line WL1 driven, stored data are read out from each of the memory cells MC11, MC21, MC31, MC41, MC51, MC61, MC71, MC81 . . . in the memory cell array 19 connected to the word line WL1 and thereafter, the sense amplifiers SA1, . . . SA8 . . . are activated and data are sensed.

On the hand, with the column select lines CSL11, CSL12 driven at the same time, the four transfer gates Q11, Q12, Q21, Q22 whose gates are connected to the column select line SCL11 are conductive and the bit line pairs BL1, /BL1; BL2, /BL2 are connected to the DQ line pairs DQ0, /DQ0; DQ1, /DQ1 through the transfer gates. At the same time, the four transfer gates Q31, Q32, Q41, Q42 whose gates connected to the column select line CSL12 are conductive and the bit line pairs BL3, /BL3; BL4, /BL4 are connected to the DQ line pairs DQ2, /DQ2; DQ3, /DQ3 through the transfer gates.

In such a manner, sensed data stored in the four memory cell MC11, MC21, MC31, MC41 and the data are transmitted to the four DQ line pairs DQ0, /DQ0 to DQ3, /DQ3 as data of four bits.

At this time, since the spare CSL driver group 18 drives none of the spare column select lines, data reading is not performed from a spare memory cell.

While in the above description, taken up as an example is the case where an address signal is supplied from the outside of the chip to select a memory cell and data are read out from the selected memory cell, in the case where data is written on the select memory cell, it is only required that data to be written are respectively given to each of the four DQ line pairs.

Then, description will be given when a defective memory cell is present in the memory cell array 19. It is assumed that a defective memory cell is, for example, the memory cell MC11. In the spare column address comparison circuit 16, a fuse in the fuse circuit 16a is selectively disconnected by melting and thereby a column address corresponding to the defective memory cell is programmed in advance.

After the programming in such a way, when the column address corresponding to the defective memory cell is input to the spare column address comparison circuit 16, a defective column address signal "Spare Select Addr." is output from the spare column address comparison circuit 16. In this case, only a signal of the 0 marked bit of the defective column address signal "Spare Select Addr." assumes an H level and all signals other than the 0 marked bit assume a L level. When the defective column address signal "Spare Select Addr." is input to the column decoder controller 15, the column decoder controller 15 sets a control signal CDRVL at a L level, a control signal /CDRVL at an H level and a control signal CDRVU at an H level and a control signal /CDRVU at a L level.

Thereby, the CSL driver 41-11 does not drive the column select line CSL11 even when receiving a column address signal. Accordingly, the two bit line pairs BL1, /BL1; BL2, /BL2 including the bit line BL1, to which the defective memory cell MC11 is connected, are not connected to the DQ line pairs DQ0, /DQ0; DQ1, /DQ1.

On the other hand, the CSL driver 41-12 drives the column select line CSL12 and the two bit line pairs BL3, /BL3; BL4, /BL4 are connected with the DQ line pairs DQ2, /DQ2; DQ3, /DQ3.

At this time, a control signal "/Select Lower DQ" assumes a L level and a control signal /Select Upper DQ" assumes an H level, wherein both control signals are input to the spare CSL driver group 18, and only a signal output to the spare column select line CSL11 from the spare CSL driver 42-1 is set at an H level. Thereby, the four transfer gates QR11, QR12, QR21, QR22 whose gates are connected to the spare column select line CSL11 are conductive and spare bit line pairs BLR1, /BLR1; BLR2, /BLR2 are connected with the DQ line pairs DQ0, /DQ0; DQ1, /DQ1 through the transfer gates.

That is, the four memory cells MC11, MC12, MC21, MC22 including the defective memory cell MC11 are thus replaced by spare memory cells MCR11, MCR12, MCR21, MCR22.

When one of the memory cells MC11, MC12, MC21, MC22 is defective, the spare column select line CSLR11 is driven instead of the column select line CSL11 and thereby as in the above case, the four memory cells MC11, MC12, MC21, MC22 including a defective memory cell are replaced by the spare memory cells MCR11, MCR12, MCR21, MCR22.

When one of the memory cells MC31, MC32, MC41, MC42 is defective, a control signal CDRVL supplied to the CSL driver 41-11 is set at an H level, a control signal /CDRVL at a L level, a control signal CDRVU supplied to the CSL driver 41-12 at a L level, a control signal /CDRVU at an H level, the column select line CSL11 is driven by the CSL driver 41-11 and the column select line CSL12 is not driven by the CSL driver 41-12 on the contrary to the above case.

At this time, a control signal "/Select Lower DQ" assumes an H level and a control signal "/Select Upper DQ" assumes a L level, wherein both control signals are input to the spare CSL driver group 18 and only a signal output to the spare column select line CSL12 from the spare CSL driver 42-1 is set at an H level. Thereby, the four transfer gates QR31, QR32, QR41, QR42 whose gates connected to the spare column select line CSL12 are conductive and the spare bit line pairs BLR1, /BLR1; BLR2, /BLR2 are connected with the DQ line pairs DQ2, /DQ2; DQ3, /DQ3 through the transfer gates.

The other column select lines CSL21, CSL22 are selected at the same time when a one-time internal column address is input.

As described above, in the DRAM pertaining to the embodiment of the present invention, a column select line is independently provided for each set of bit lines of half the number of DQ line pairs, and two column select lines are activated simultaneously. Memory cells of the memory cell array are replaced by spare memory cells in such a manner that the number of memory cells replaced at one time corresponds to the activated column select lines. Since one unit of remedy used in this column redundancy technology is as small as possible, the remedy efficiency can be enhanced. In the case where the remedy efficiency is controlled to be equal to that of the prior art, the number of spare memory cells that must be provided can be reduced. Accordingly, the chip area can be reduced, and the cost for manufacturing the chips can be reduced. In addition, even where the number of DQ line pairs is increased for attaining high speed and/or wide band width, the remedy efficiency can be remarkably enhanced.

Figure 6A:
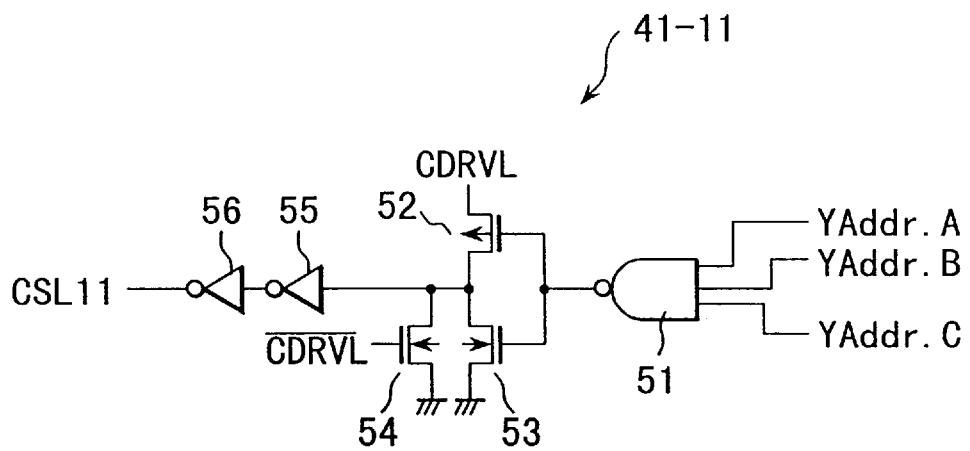
FIGS. 6A and 6B are circuit diagrams showing concrete structures of a CSL driver in FIG. 4 and a spare CSL driver of FIG. 5.

FIG. 6A shows a concrete circuit structure of the CSL driver 41-11 which selectively drives the column select line CSL11 in FIG. 4. All of the other CSL drivers are of the same circuit structure with the exception that settings of the upper or lower order level of an input column address signal and a control signal CDLV, /CDLV, which are input, are different.

The CSL driver 41-11 is provided with three-input NAND gate 51, a p-channel transistor 52, two n-channel transistors 53, 54 and two inverters 55, 56.

Supplied to the NAND gate 51 are a signal of the 0 marked bit of a column address signal YAddr. A having the (N+1) bits, a signal of the 0 marked bit of a column address signal YAddr. B having the (N+1) bits, a signal of the 0 marked bit of a column address signal YAddr. C having the (M+1) bit.

A source of the p-channel transistor 52 is supplied with the control signal CDRVL. A gate of the transistor 52 is connected to an output node of the NAND gate 51. A drain of the n-channel transistor 53 is connected to a drain of the transistor 52.

A source of the transistor 53 is connected to a node of earth potential. The gate of the transistor 53 is connected to the output node of the NAND gate 51.

A drain of the n-channel transistor 54 is connected to a drain common connect node of the transistors 52, 53. A source of the transistor 54 is connected to the node of earth potential. The gate of the transistor 54 is supplied with the control signal /CDRVL.

An input node of the inverter 55 is connected to a drain common connection node of the transistors 52, 53, 54. An input node of the inverter 56 is connected to an output node of the inverter 55. An output node of the inverter 56 is connected to the column select line CSL11.

In a CSL driver with such a structure, when all signals of the 0 marked bit of column address signals YAddr. A, YAddr. B, YAddr. C assume an H level, an output signal of the NAND gate 51 assumes a L level. When a control signal CDRVL is at an H level and a control signal /CDRVL is at a L level, since the source of the transistor 52 is supplied with the H level of the signal CDRVL and the transistor 54 enter the OFF state, a circuit consisting of the transistors 52, 53 works as an inverter and an output signal of the drain common connection node of the transistors 52, 53, 54 assumes an H level. Accordingly, an output signal of the inverter 55 is at a L level and an output signal of the inverter 56 is at an H level, and the corresponding column select line CSL11 is selectively driven.

Here, when at least one of signals of the 1 marked bit of the column address signals YAddr. A, YAddr. B, YAddr. C assumes a L level, an output signal of the NAND gate 51 assumes an H level and the corresponding column select line CSL11 is not selected.

When a control signal CDRVL is at a L level and a control signal /CDRVL is at an H level, since the gate of the transistor 54 is input with an H level signal /CDRVL, the transistor 54 enters the ON state, an output signal of the drain common connection node of the transistors 52, 53, 54 assumes a L level. Accordingly, an output signal of the inverter 55 assumes an H level, an output signal of the inverter 56 assumes a L level and the corresponding column select line CSL11 is not selected.

Figure 6B:
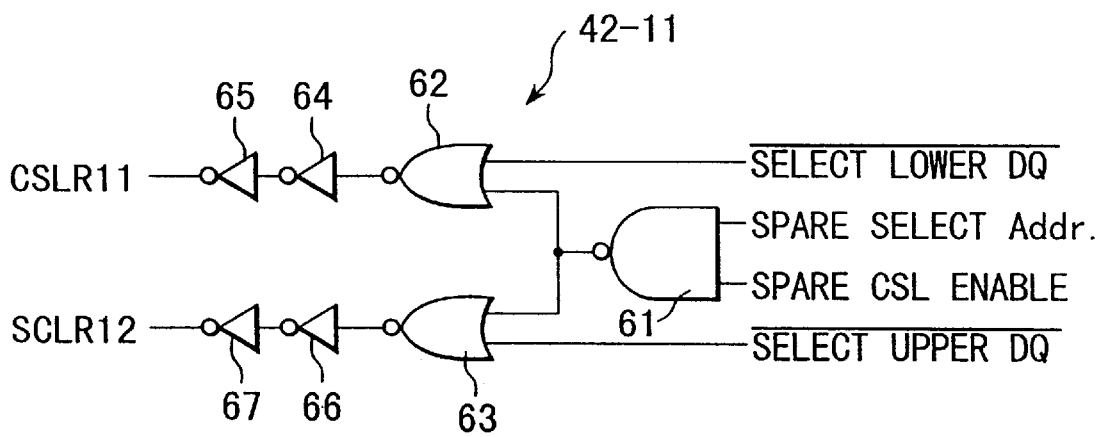

FIG. 6B shows a concrete circuit structure of the spare CSL driver 42-11 in FIG. 5. All the other spare CSL drivers have the same circuit structure as this only with the exception that a bit position of an input defective column address signal "Spare Select Addr." to be input is different.

The spare CSL driver 42-11 is provided with a two-input NAND gate 61, 2 two-input NOR gates 62, 63 and 4 inverters 64 to 67.

The NAND gate 61 is input with a signal of one bit position of a defective column address signal "Spare Select Addr." and a spare CSL enable signal "Spare CSL Enable".

One NOR gate 62 is input with a control signal "/Select Lower DQ" for selecting a lower order side DQ line and an output signal of the NAND gate 61.

An input node of the inverter 64 is connected to an output node of the NOR gate 62. An input node of the inverter 65 is connected to an output node of the inverter 64. An output node of the inverter 65 is connected to the spare column select line CSL11.

The other NOR gate 63 is input with a control signal "/Select Upper DQ" for selecting an upper order side DQ line and an output signal of the NAND gate 61.

An input node of the inverter 66 is connected with an output node of the NOR gate 63. An input node of the inverter 67 is connected to an output node of the inverter 66. An output node of the inverter 67 is connected to the spare column select line CSL12.

In such a structure, when a signal of one bit position of an defective column address signal "Spare Select Addr." and a spare CSL enable signal "Spare CSL Enable", input to the NAND gate 61, both are at an H level, an output signal of the NAND gate 61 assumes a L level.

At this time, if a control signal "/Select Lower DQ" for selecting a lower order side DQ line assumes a L level, an output signal of the NOR gate 62 assumes an H level, an output signal of the inverter 64 assumes a L level and a output signal of the inverter 65 assumes an H level, whereby the spare column select line CSLR11 is selectively driven.

On the other hand, when an output signal of the NAND gate 61 assumes a L level, if a control signal "/Select Upper DQ" for selecting an upper order side DQ line assumes a L level, an output signal of the NOR gate 63 assumes an H level, an output signal of the inverter 65 assumes a L level and an output signal of the inverter 66 assumes an H level, whereby the spare column select line CSLR12 is selected and driven.

Figure 7:
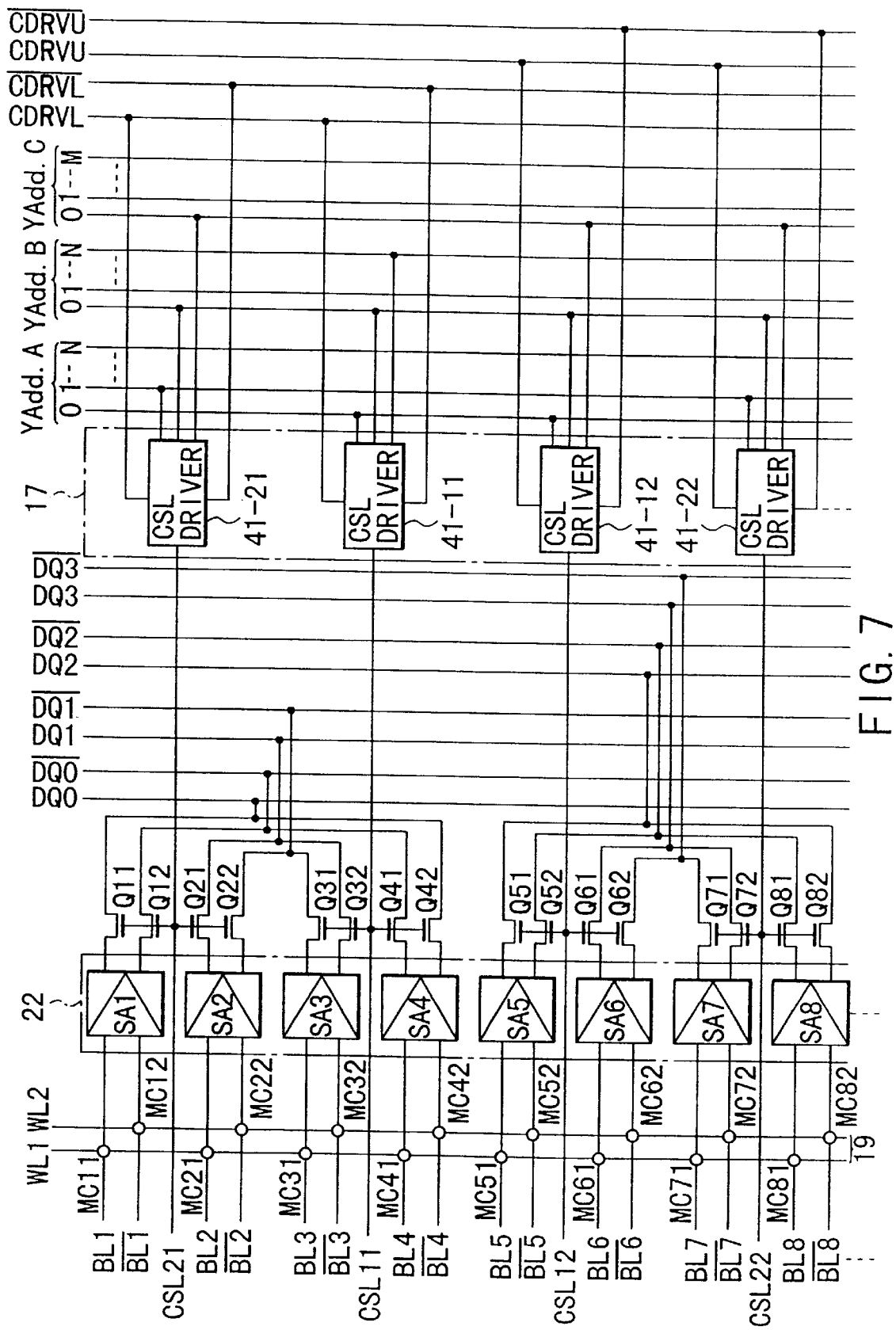
FIG. 7 is a circuit diagram showing another concrete structure of the memory cell array of the DRAM and its peripheral circuits, shown in FIG. 2.

FIG. 7 shows another concrete circuit structure of the memory cell array of the DRAM and its periphery circuits, shown in FIG. 2. Parts corresponding to FIG. 4 are indicated by the same marks and descriptions on the parts are omitted, while descriptions are given only on parts different from FIG. 4.

In the case of FIG. 4, the gates of the transfer gates Q11, Q12, Q21, Q22 are connected to the column select line CSL11. In the case of FIG. 7, however, the gates are connected to the column select line CSL21.

Furthermore, in the case of FIG. 4, the gates of the transfer gates Q31, Q32, Q41, Q42 are connected to between the bit line pairs BL3, /GL3; BL4, /BL4 and DQ line pairs DQ2, /DQ2; DQ3, /DQ3 and the gates are connected to the transfer gate CSL12. In the case of FIG. 7, however, the transfer gates Q31, Q32; Q41, Q42 are connected to between the bit line pairs BL3, /BL3; BL4, /BL4 and DQ line pairs DQ0, /DQ0; DQ1, /DQ1 and the gates are connected to the column select line CSL11.

Besides, in the case of FIG. 4, the transfer gates Q51, Q52, Q61, Q62 are connected to between the bit line pairs BL5, /BL5; BL6, /BL6 and the DQ line pairs DQ0, /DQ0; DQ1, /DQ1 and the gates are connected to the column select line CSL21. In the case of FIG. 7, however, the transfer gates Q51, Q52, Q61, Q62 are connected to between the bit line pairs BL5, /BL5; BL6, /BL6 and the DQ line pairs DQ2, /DQ2; DQ3, /DQ3 and the gates are connected to the column select line CSL12.

In FIG. 7, the column select lines CSL11, CSL12 which are simultaneously driven by the CSL driver group 17 are disposed in an abutting manner on each other between the column select lines CSL21, CSL22 which are simultaneously driven by the CSL driver group 17 and the column select lines CSL21, CSL22 which are not selected when the column select lines CSL11, CSL12 are selected are respectively disposed in an abutting manner on the column select lines CSL11, CSL12.

That is, a plurality of column select lines are disposed in such a manner that not-selected column select lines which are not selected by the CSL driver group 17 are respectively disposed in an abutting manner on selected column select lines which are simultaneously selected by the CSL driver group 17.

A description will now be given of the layout of the transfer gates whose gates are connected to column select lines. In general, the transfer gates are arranged adjacent to the sense amplifiers in relation to each of the bit line pairs. Like the sense amplifiers, the transfer gates must be arranged in accordance with the arrangement pitches of the memory cells, so that the layout is inevitably restricted in the direction perpendicular to the bit lines. As in FIG. 7, when a plurality of column select lines are disposed in such a manner that not-selected column select lines which are not selectively driven by the CSL driver group 17 are respectively disposed in an abutting manner on selected column select lines which are simultaneously driven by the CSL driver group 17, the transfer gates Q11 and Q42, Q12 and Q41, Q21 and Q32, and Q22 and Q31 can functionally share source/ drain diffusion layers therebetween, and the diffusion layers and the DQ lines can be connected together through common contact sections. Accordingly, the layout that provides high efficiency can be determined, and the transfer gates can be arranged easily in the direction perpendicular to the bit lines. In addition, since the number of diffusion layers connected through the contacts to the DQ lines is reduced to half, the diffusion capacitance, which is a component of the capacitance of the DQ lines, can be reduced to half. Accordingly, the power consumption can be reduced, a high-speed operation can be realized, small-sized transistors can be employed in a circuit such as a write buffer used for the driving of DQ lines, etc.

Figure 8:
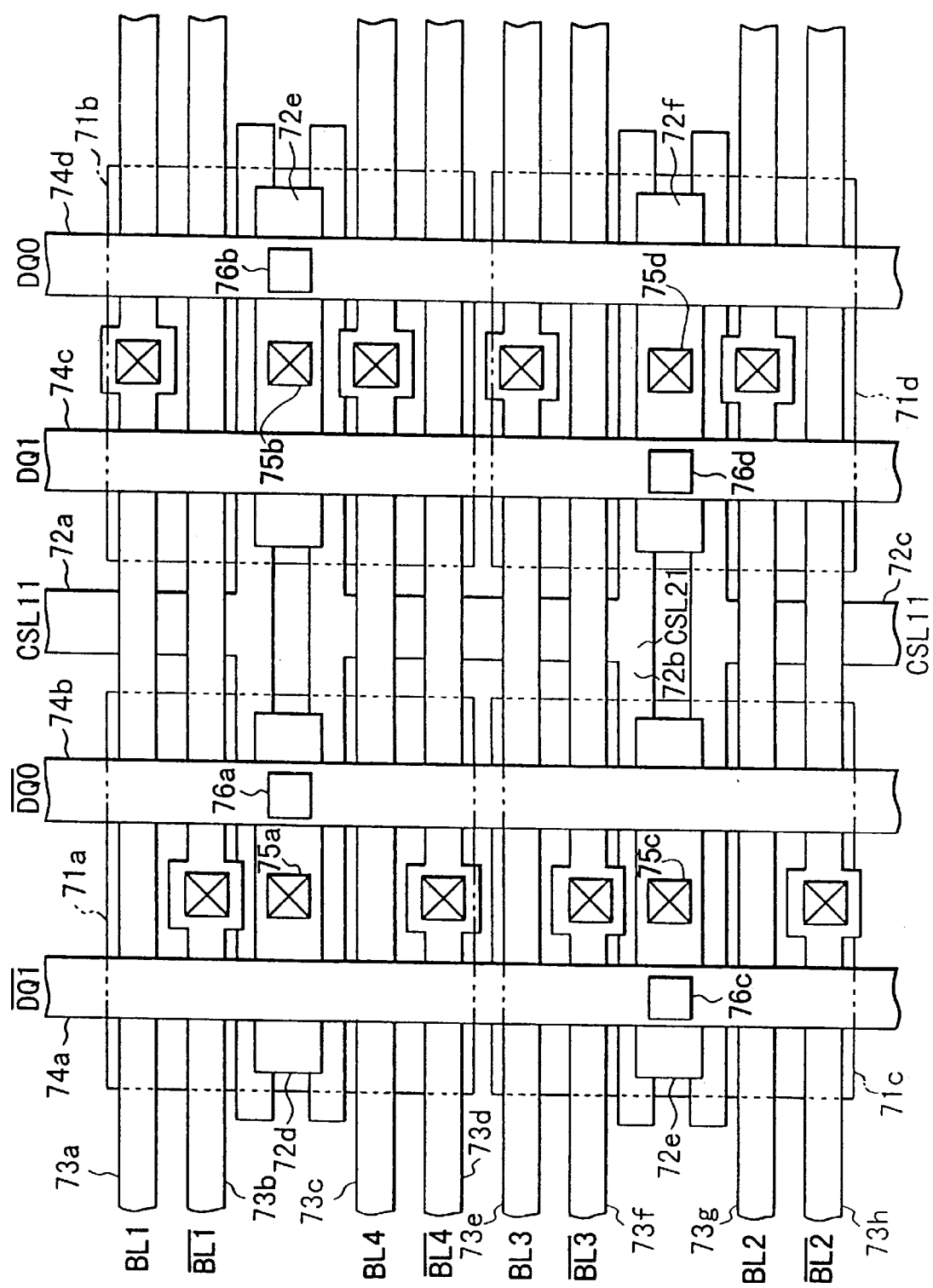
FIG. 8 is a diagram showing a pattern layout including a transfer gate and a DQ line of FIG. 7.

FIG. 8 shows an example of a pattern layout of the transfer gates and the DQ lines of FIG. 7. In the figure, 71a to 71d indicate source/drain diffusion layers of the transfer gates respectively. Reference marks 72a, 72b, 72c are made of, for example, polysilicon, a metal or the like and are an interconnect layer which constitutes gate electrodes of the transfer gates. Reference marks 72d to 72f are an interconnect layer which is same as the interconnect layer 72a, 72b, 72c. Reference marks 73a to 73h are an interconnect layer which is the upper layer directly formed on the interconnect layer 72a to 72f, which constitutes the bit line pairs BL0, /BL0 . . . . In addition, 74a to 74d are an interconnect layer which is again the upper layer on the interconnect layer 73a to 73h, which constitutes the DQ line pairs DQ0, /DQ0 . . . .

The interconnect layer 72d is connected to the source/ drain diffusion layer 71a which underlies the layer 72d through the contact 75a and the interconnect layer 72d is connected to the interconnect layer 74b which constitutes a DQ line /DQ0 through a via 76a. That is, two transfer gates (Q12, Q41) are formed being disposed one on the other along an up-and-down direction with the contact 75a interposing therebetween and the two transfer gates and the DQ line /DQ0 shares a contact section functionally. Like this, 75b, 75c and 75d indicate contacts and 76b, 76c and 76d are vias.

When a pattern layout like FIG. 8 is adopted, the number of contact sections whereby source/drain diffusion layers of transfer gates and DQ lines are connected is decreased to one half, whereby an integration degree can be increased, as compared with the case where source/drain diffusion layers of transfer gates are respectively provided with dedicated contact sections and then connected to DQ lines.

Figure 9:
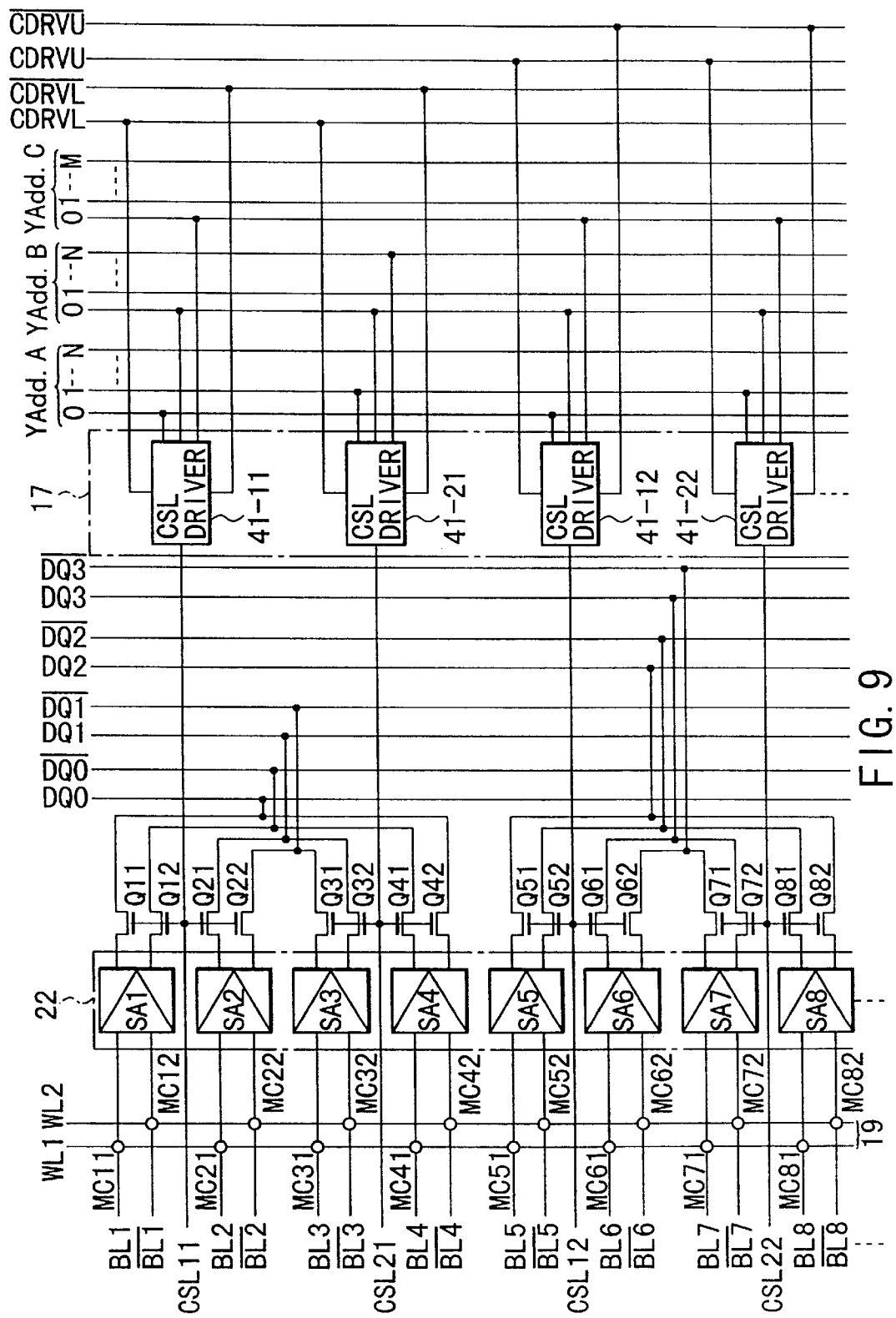
FIG. 9 is a circuit diagram showing a further concrete structure the memory cell array of the DRAM and its peripheral circuits, shown in FIG. 2.

FIG. 9 shows another concrete circuit structure of the memory cell array of the DRAM and its peripheral circuits shown in FIG. 2.

What a circuit shown in FIG. 9 is different from that of FIG. 7 is that a column select lines CSL21 which is not selected when column select lines CSL11, CSL12 are selected are disposed between the column select lines CSL11, CSL12, which are simultaneously selected and driven by the CSL driver group 17 and at the same time, a column select line CSL12 which are not selected when column select lines CSL21, CSL22 are selected are disposed between the column select lines CSL21, CSL22, which are simultaneously selected and driven by the CSL driver group 17.

That is, a plurality of column select lines are disposed in such a manner that the non-selection column select lines which are not selectively driven by the CSL driver group 17 are respectively disposed in an abutting manner on both sides of each of the selection column select lines which are simultaneously selected and driven by the CSL driver group 17.

In this case, too, transfer gates Q11 and Q42, Q12 and Q41, Q21 and Q32, Q22 and Q31, Q51 and Q82, Q52 and Q81, Q61 and Q72, Q62 and Q71 can functionally share source/drain diffusion layers therebetween and can be connected to DQ lines through common contact sections and thereby an integration degree can be increased for the same reason as in the case of FIG. 7.

Figure 10A:
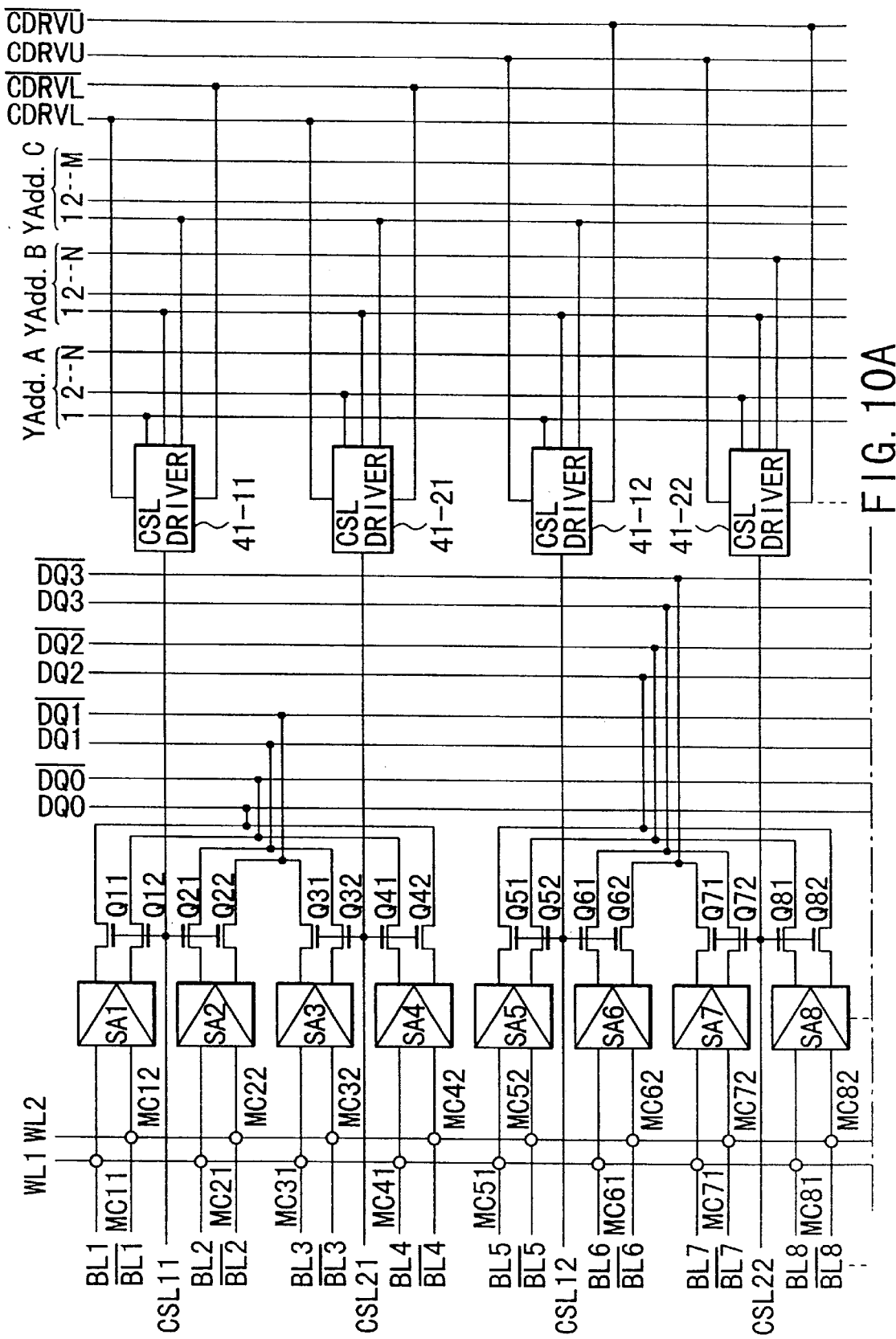
FIGS. 10A and 10B are circuit diagrams showing the memory cell array of the DRAM and its peripheral circuits, shown in FIG. 9 together with a spare memory cell array and its peripheral circuits.
Figure 10B:
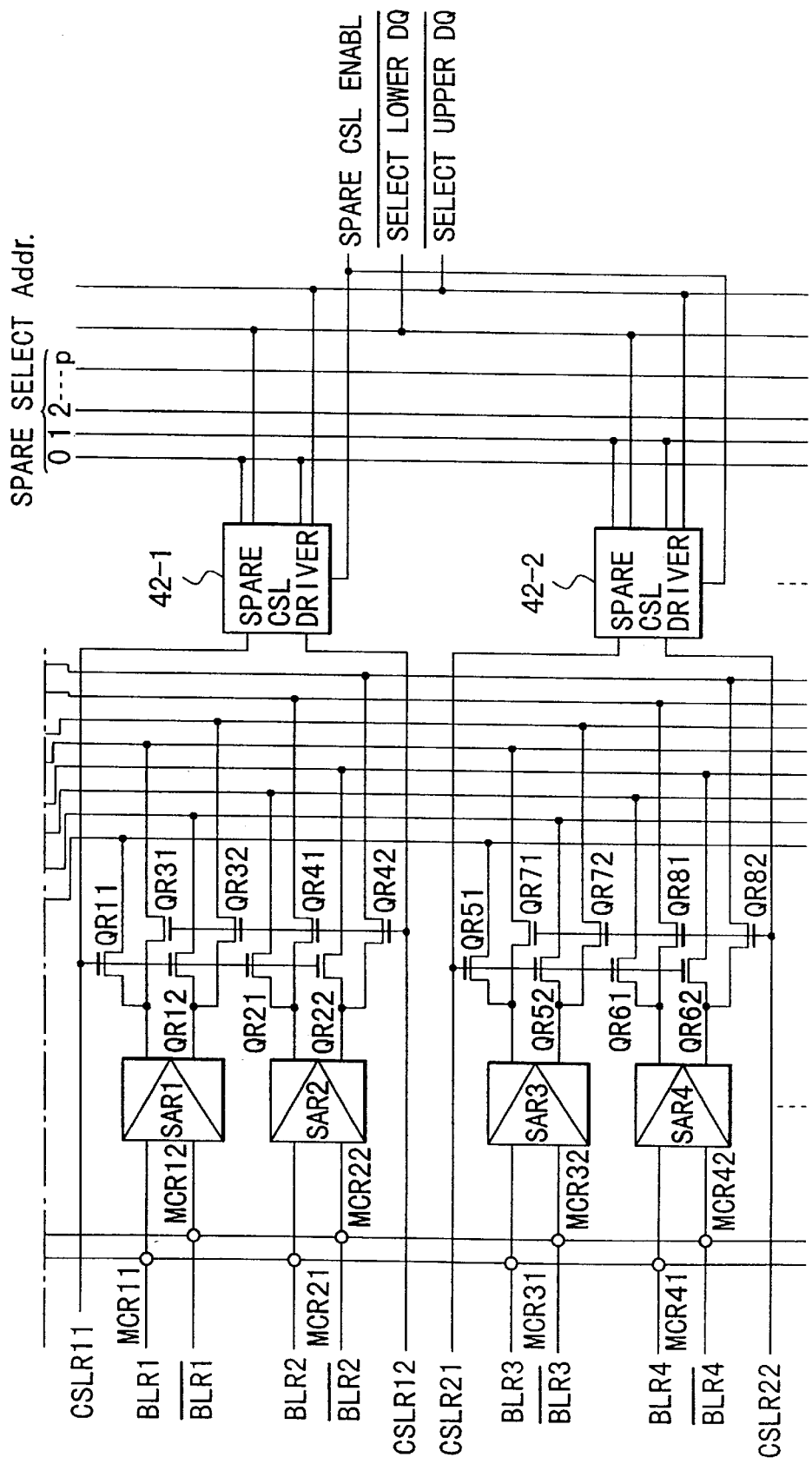

FIG. 10A shows the memory cell array of the DRAM and its peripheral circuits shown in FIG. 9 and FIG. 10B shows a spare memory cell array and its peripheral circuits and its peripheral circuits.

Only a structure on the spare side will here be described. MCR11, MCR12 to MCR41, MCR42 . . . are spare memory cells, BLR1, /BLR1, . . . BLR4, /BLR4 . . . are spare bit line pairs, SAR1, SAR4 . . . are sense amplifiers for sensing data read out on the spare bit line pairs, the sense amplifiers being connected to the spare bit line pairs BLR1, /BLR1, . . . BLR4, /BLR4 . . . . transfer gates QR11, QR12, . . . QR81, QR82 . . . for respectively effecting controlled connection of the spare bit line pairs BLR1, /BLR1, . . . BLR4, /BLR4 . . . after data are sensed by the sense amplifiers SAR1, . . . SAR4 with the four DQ line pairs DQ0, /DQ0 to DQ3, /DQ3 and CSLR11, CSLR12, CSLR21, CSLR22 . . . are spare column select lines.

The two transfer gates QR11, QR12 are connected to between the spare bit line pair BLR1, /BLR1 and the DQ line pair DQ0, /DQ0 and the gates are connected to the spare column select line CSLR11 in common.

The two transfer gates QR21, QR22 are connected to between the spare bit line pair BLR2, /BLR2 and the DQ line pair DQ1, /DQ1 and the gates are connected to the spare column select line CSLR11 in common.

The two transfer gates QR31, QR32 are connected to between the spare bit line pair BLR1, /BLR1 and the DQ line pair DQ2, /DQ2 and the gates are connected to the spare column select line CSLR12 in common.

The two transfer gates QR41, QR42 are connected to between the spare bit line pair BLR2, /BLR2 and the DQ line pair DQ3, /DQ3 and the gates are connected to the spare column select line CSLR12 in common.

The two transfer gates QR51, QR52 are connected to between the spare bit line pair BLR3, /BLR3 and the DQ line pair DQ0, /DQ0 and the gates are connected to the spare column select line CSLR21 in common.

The two transfer gates QR61, QR62 are connected to between the spare bit line pair BLR4, /BLR4 and the DQ line pair DQ1, /DQ1 and the gates are connected to the spare column select line CSLR12 in common.

The two transfer gates QR71, QR72 are connected to between the spare bit line pair BLR2, /BLR2 and the DQ line pair DQ2, /DQ2 and the gates are connected to the spare column select line CSLR21 in common.

The two transfer gates QR81, QR82 are connected to between the spare bit line pair BLR2, /BLR2 and the DQ line pair DQ3, /DQ3 and the gates are connected to the spare column select line CSLR21 in common.

In such a structure, when the spare column select lines CSLR11, CSLR21 are selectively driven by output of the spare CSL driver group 18 instead of the four column select lines CSL11, CSL12, CSL21, CSL22, the memory cells MC1, MC12, . . . MC81, MC82 . . . in the memory cell array are replaced with the spare cells MCR11, MCR12, . . . MC41, MC42 . . . in the spare memory cell array.

Figure 11:
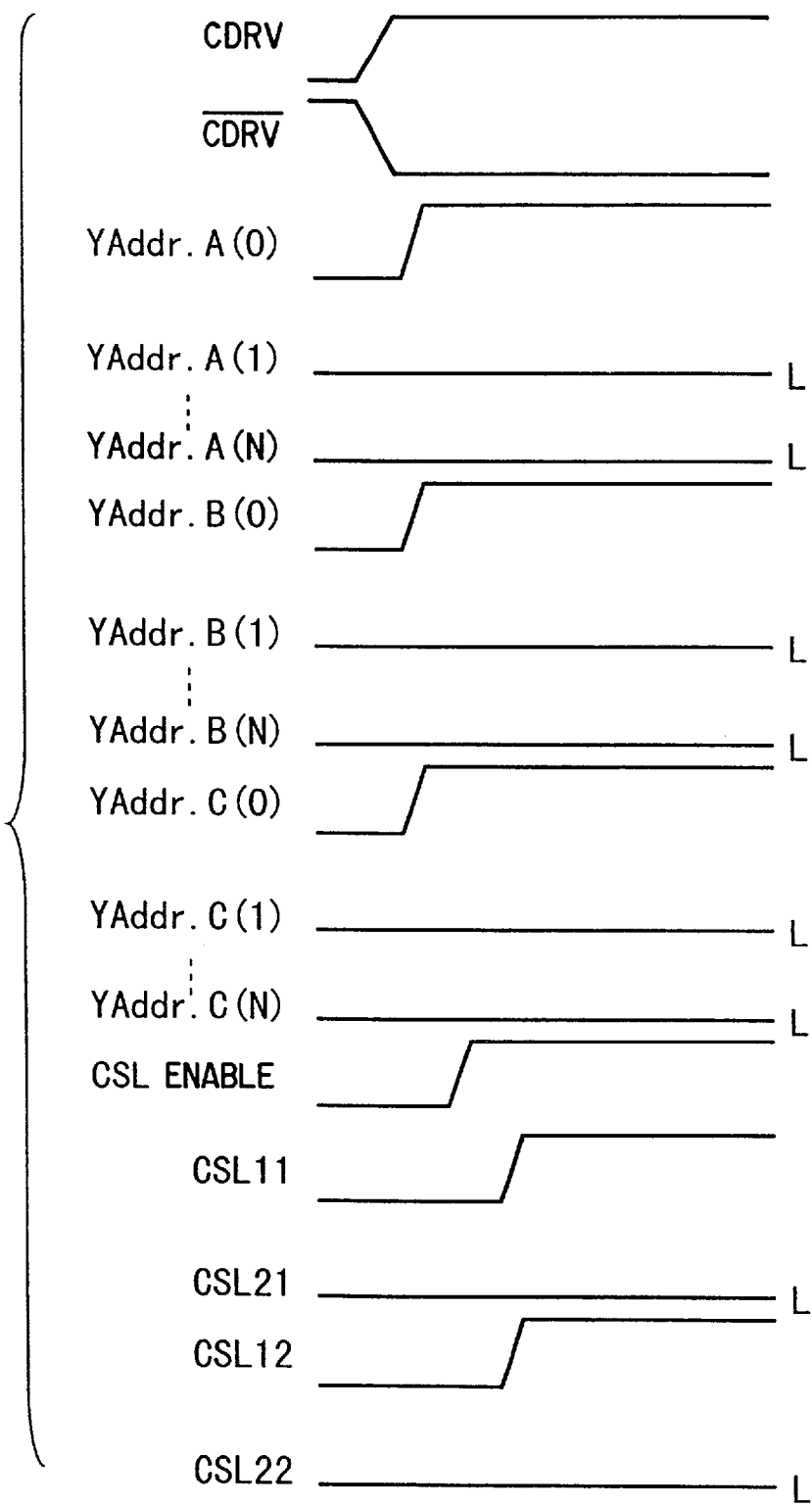
FIG. 11 is a wave form diagram showing an example of operation of the circuits of FIG. 10.

FIG. 11 shows wave forms when memory cells in the memory cell array 19 are normal and the column select lines CSL11, CSL12 simultaneously are selected and driven in FIGS. 10A and 10B. Here, a figure in parentheses attached at the end of each of column address signals Y Addr. A, Y Addr. B, Y Addr. C shows a bit position of the address signal.

That is, when the column address signals Y Addr. A (0), Y Addr. B (0), Y Addr. C (0) all assume an H level, the column select lines CSL11, CSL12 both assume an H level and the column select lines CSL11, CSL12 simultaneously are selected and driven.

Figure 12:
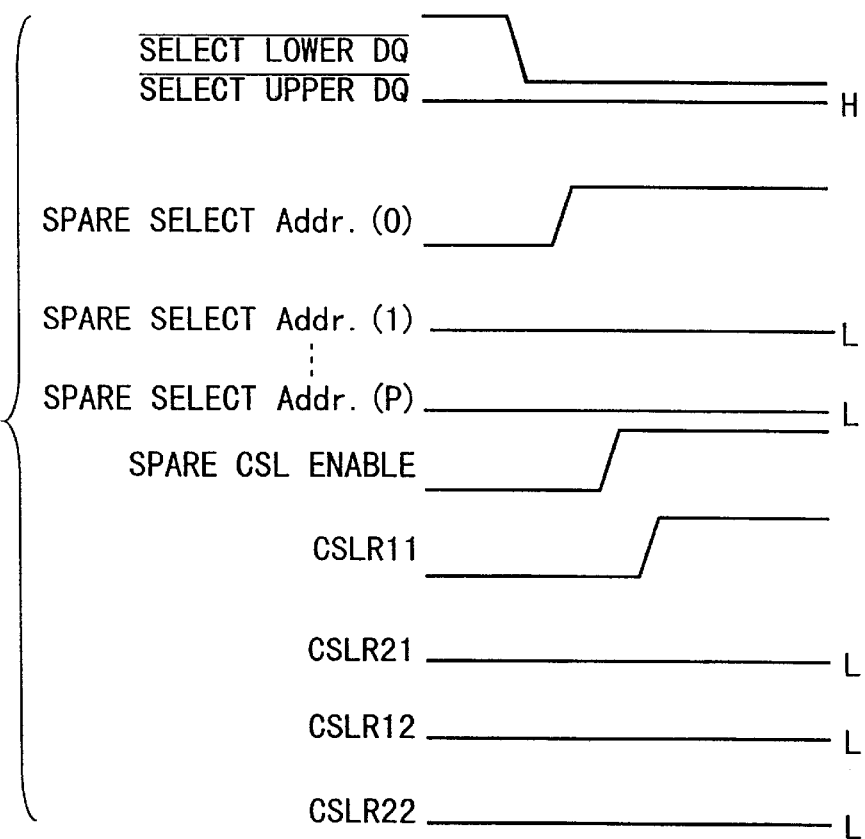
FIG. 12 is a wave form diagram showing an example of operation of the circuits of FIG. 10.

FIG. 12 shows wave forms when a defect is present in a memory cell relating with the column select line CSL11 in the memory cell array 19 and the spare column select line CSLR11 is driven instead of the column select line CSL11 in FIGS. 10A and 10B. Here, a figure in parentheses attached at the end of the defective column address signal "Spare select Addr." indicates a bit position of an address signal.

Needless to say, the present invention is in no way limited to the embodiment described above. It can be modified in various manners when reduced to practice. For example, the above embodiment was described, referring to the case where a column select line is independently provided for each set of bit lines of half the number of DQ line pairs and a memory cell of the memory cell array is replaced by a spare memory cell. In place of this structure, a column select line may be independently provided for each set of bit lines the number of which is 1/m of that of DQ line pairs (m: an integer of not less than 2), and a memory cell of the memory cell array may be replaced by a spare memory cell.

As has been described, according to the present invention, there can be provided a semiconductor memory device in which not only is improvement of a remedy efficiency of a defective product achieved without increase in the number of spare memory cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells;
   a first to eighth bit lines connected to said plurality of memory cells;
   a plurality of word lines connected to said plurality of memory cells;
   a first to fourth data lines;
   a first transfer gate connected between said first bit line and said first data line, said first transfer gate has a gate electrode;
   a second transfer gate connected between said second bit line and said second data line, said second transfer gate has a gate electrode;
   a third transfer gate connected between said third bit line and said second data line, said third transfer gate has a gate electrode;
   a fourth transfer gate connected between said fourth bit line and said first data line, said fourth transfer gate has a gate electrode;
   a fifth transfer gate connected between said fifth bit line and said third data line, said fifth transfer gate has a gate electrode;
   a sixth transfer gate connected between said sixth bit line and said fourth data line, said sixth transfer gate has a gate electrode;
   a seventh transfer gate connected between said seventh bit line and said fourth data line, said seventh transfer gate has a gate electrode;

an eighth transfer gate connected between said eighth bit line and said third data line, said eighth transfer gate has a gate electrode;

a first column select line connected to said gate electrodes of said first and second transfer gates;

a second column select line connected to said gate electrodes of said third and fourth transfer gates;

a third column select line connected to said gate electrodes of said fifth and sixth transfer gates;

a fourth column select line connected to said gate electrodes of said seventh and eighth transfer gates;

a first column select line driver for selecting and driving said first column select line, wherein said first column select line driver being activated in response to a column address;

a second column select line driver for selecting and driving said second column select line, wherein said second column select line driver being activated in response to a column address;

a third column select line driver for selecting and driving said third column select line, wherein said third column select line driver being activated in response to a same column address as the column address which is supplied to said second column select line driver; and a fourth column select line driver for selecting and driving said fourth column select line, wherein said fourth column select line driver being activated in response to a same column address as the column address which is supplied to said first column select line driver.

2. The device according to claim 1, further comprising:

a plurality of spare memory cells;

a first to fourth spare bit lines connected to said plurality of spare memory cells;

a first spare transfer gate connected between said first spare bit line and said first data line, said first spare transfer gate has a gate electrode;

a second spare transfer gate connected between said first spare bit line and said third data line, said second spare transfer gate has a gate electrode;

a third spare transfer gate connected between said second spare bit line and said second data line, said third spare transfer gate has a gate electrode;

a fourth spare transfer gate connected between said second spare bit line and said fourth data line, said fourth transfer gate has a gate electrode;

a fifth spare transfer gate connected between said third spare bit line and said first data line, said fifth transfer gate has a gate electrode;

a sixth spare transfer gate connected between said third spare bit line and said third data line, said sixth transfer gate has a gate electrode;

a seventh spare transfer gate connected between said fourth spare bit line and said second data line, said seventh transfer gate has a gate electrode;

an eighth spare transfer gate connected between said fourth spare bit line and said fourth data line, said eighth transfer gate has a gate electrode;

a first spare column select line connected to said gate electrodes of said first and third spare transfer gates;

a second spare column select line connected to said gate electrodes of said second and fourth spare transfer gates;

a third spare column select line connected to said gate electrodes of said fifth and seventh spare transfer gates; and a fourth spare column select line connected to said gate electrodes of said sixth and eighth spare transfer gates.

3. The device according to claim 2, wherein said plurality of memory cells are divided into $2^n$ (n is a positive integer) memory cell array blocks each having memory cells the number of which is $\frac{1}{2^n}$ times the total number of memory cells and said spare memory cell is provided for each memory cell array block.

4. The device according to claim 1, wherein an output signal from said first column select line driver and an output signal from said fourth column select line driver activated simultaneously in response to one-time column address input, thereby allowing said first and fourth column select line to be selected and driven simultaneously, and wherein an output signal from said second column select line driver and an output signal from said third column select line driver activated simultaneously in response to one-time column address input, thereby allowing said second and third column select line to be selected and driven simultaneously.

5. A semiconductor memory device comprising:

a plurality of memory cells;

a first to eighth bit line pairs connected to said plurality of memory cells;

a plurality of word lines connected to said plurality of memory cells;

a first to fourth data line pairs;

a first transfer gate pair connected between said first bit line pair and said first data line pair, each of said first transfer gate pair has a gate electrode;

a second transfer gate pair connected between said second bit line pair and said second data line pair, each of said second transfer gate pair has a gate electrode;

a third transfer gate pair connected between said third bit line pair and said second data line pair, each of said third transfer gate pair has a gate electrode;

a fourth transfer gate pair connected between said fourth bit line pair and said first data line pair, each of said fourth transfer gate pair has a gate electrode;

a fifth transfer gate pair connected between said fifth bit line pair and said third data line pair, each of said fifth transfer gate pair has a gate electrode;

a sixth transfer gate pair connected between said sixth bit line pair and said fourth data line pair, each of said sixth transfer gate pair has a gate electrode;

a seventh transfer gate pair connected between said seventh bit line pair and said fourth data line pair, each of said seventh transfer gate pair has a gate electrode;

an eighth transfer gate pair connected between said eighth bit line pair and said third data line pair, each of said eighth transfer gate pair has a gate electrode;

a first column select line connected to said gate electrodes of said first and second transfer gate pairs;

a second column select line connected to said gate electrodes of said third and fourth transfer gate pairs;

a third column select line connected to said gate electrodes of said fifth and sixth transfer gate pairs;

a fourth column select line connected to said gate electrodes of said seventh and eighth transfer gale pairs;

a first column select line driver for selecting and driving said first column select line, wherein said first column select line driver being activated in response to a column address;

a second column select line driver for selecting and driving said second column select line, wherein said second column select line driver being activated in response to a column address;

a third column select line driver for selecting and driving said third column select line, wherein said third column select line driver being activated in response to a same column address as the column address which is supplied to said second column select line driver; and a fourth column select line driver for selecting and driving said fourth column select line, wherein said fourth column select line driver being activated in response to a same column address as the column address which is supplied to said first column select line driver.

6. The device according to claim 5, further comprising:

a plurality of spare memory cells;

a first to fourth spare bit line pairs connected to said plurality of spare memory cells;

a first spare transfer gate pair connected between said first spare bit line pair and said first data line pair, each of said first spare transfer gate pair has a gate electrode;

a second spare transfer gate pair connected between said first spare bit line pair and said third data line pair, each of said second spare transfer gate pair has a gate electrode;

a third spare transfer gate pair connected between said second spare bit line pair and said second data line pair, each of said third spare transfer gate pair has a gate electrode;

a fourth spare transfer gate pair connected between said second spare bit line pair and said fourth data line pair, each of said fourth transfer gate has a gate electrode;

a fifth spare transfer gate pair connected between said third spare bit line pair and said first data line pair, each of said fifth transfer gate pair has a gate electrode;

a sixth spare transfer gate pair connected between said third spare bit line pair and said third data line pair, each of said sixth transfer gate pair has a gate electrode;

a seventh spare transfer gate pair connected between said fourth spare bit line pair and said second data line pair, each of said seventh transfer gate pair has a gate electrode;

an eighth spare transfer gate pair connected between said fourth spare bit line pair and said fourth data line pair, each of said eighth transfer gate pair has a gate electrode;

a first spare select line connected to said gate electrodes of said first and third spare transfer gate pairs;

a second spare column select line connected to said gate electrodes of said second and fourth spare transfer gate pairs;

a third spare column select line connected to said gate electrodes of said fifth and seventh spare transfer gate pairs; and a fourth spare column select line connected to said gate electrodes of said sixth and eighth spare transfer gate pairs.

7. The device according to claim 5, wherein an output signal from said first column select line driver and an output signal from said fourth column select line driver activated simultaneously in response to one-time column address input, thereby allowing said first and fourth column select line to be selected and driven simultaneously, and wherein an output signal from said second column select line driver and an output signal from said third column select line driver activated simultaneously in response to one-time column address input, thereby allowing said second and third column select line to be selected and driven simultaneously.

8. A semiconductor memory device comprising:

a plurality of memory cells;

a plurality of bit lines connected to said plurality of memory cells, said plurality of bit lines including a first group of bit lines and a second group of bit lines;

a plurality of word lines connected to said plurality of memory cells;

a plurality of data lines including a first group of data lines and a second group of data lines;

a first group of transfer gates connected between said first group of bit lines and said first group of data lines, each of said first group of transfer gates having a gate electrode;

a second group of transfer gates connected between said second group of bit lines and said second group of data lines, each of said second group of transfer gates having a gate electrode;

a first column select line connected to said corresponding gate electrode of said first group of transfer gates;

a second column select line connected to said corresponding gate electrode of said second group of transfer gates;

a first column select line driver according with said first column select line, the first colon select line driver being activated in response to a column address; and a second column select line driver according with said second column select line, the second column select line driver being activated in response to a same column address as the column address which is applied to said first column select line driver, said first and second column select line drivers being selected and driven simultaneously in response to said column address.

9. The device according to claim 8, further comprising:

a third column select line which is arranged adjacent to the first column select line, the third column select line is not selected and driven simultaneously with said first and second column select lines; and a fourth column select line which is arranged adjacent to the second column select line, the fourth column select line is not selected and driven simultaneously with said first and second column select lines.

10. The device according to claim 9, further comprising:

a third group of transfer gates connected to the third column select line; and a fourth group of transfer gates connected to the fourth column select line, each of said first group of transfer gates including a first source/drain diffusion layer, each of said second group of transfer gates including a second source/drain diffusion layer, each of said third group of transfer gates including a third source/drain diffusion layer which is identical with said first source/drain diffusion layer, and each of said fourth group of transfer gates including a fourth source/drain diffusion layer which is identical with said second source/drain diffusion layer.

11. The device according to claim 8, further comprising;

a fifth column select line which is arranged between the first and second column select lines, the fifth column select line is not selected and driven simultaneously with said first and second column select lines.

12. The device according to claim 11, wherein the plurality of memory cells are divided into $2^n$ is a positive integer) memory cell array blocks each having memory cells the number of which is $\frac{1}{2^n}$ times the total number of memory cells and a spare memory cell is provided for each memory cell array block.

13. The device according to claim 8, further comprising:
a plurality of spare memory cells;
a plurality of spare bit lines connected to said plurality of spare memory cells;
a first group of spare transfer gates arranged between said plurality of spare bit lines and said first group of data lines;
a second group of spare transfer gates arranged between said plurality of spare bit lines and said second group of data lines;
a first spare column select line connected to said first group of spare transfer gates; and
a second spare column select line connected to said first group of spare transfer gates,
wherein said plurality of spare bit lines are connected to the first group of data lines by way of the first group of spare transfer gates whose conductivity is controlled by said first spare column select line, and said plurality of spare bit lines are connected to the second group of said lines by way of the second group of spare transfer gates whose conductivity is controlled by said second spare column select line.

14. A semiconductor memory device comprising:
a plurality of memory cells;
a plurality of bit line pairs connected to said plurality of memory cells, said plurality of bit line pairs including a first group of bit line pairs and a second group of bit line pairs;
a plurality of word lines connected to said plurality of memory cells;
a plurality of data line pairs including a first group of data line pairs and a second group of data line pair;
a fist group of transfer gate pairs connected between said first group of bit line pairs and said first group of data line pairs, each of said first group of transfer gate pairs having a gate electrode;
a second group of transfer gate pairs connected between said second group of bit line pairs and said second group of data line pairs, each of said second group of transfer gate pairs having a gate electrode;
a first column select line connected to said corresponding gate electrode of said first group of transfer gate pairs;
a second column select line connected to said corresponding gate electrode of said second group of transfer gate pairs;
a first column select line driver according with said first column select line, the first column select line driver being activated in response to a column address; and
a second column select line driver according with said second column select line, the second column select line driver being activated in response to a same column address as the column address which is applied to said first column select line driver, said first and second column select line drivers being selected and driven simultaneously in response to said column address.

15. The device according to claim 14, further comprising:
a plurality of spare memory cells;
a plurality of spare bit line pairs connected to said plurality of spare memory cells;
a first group of spare transfer gate pairs arranged between said plurality of spare bit line pairs and said first group of data line pairs;
a second group of spare transfer gate pairs arranged between said plurality of spare bit line pairs and said second group of data line pairs;
a first spare column select line connected to said first group of spare transfer gate pairs; and
a second spare column select line connected to said second group of spare transfer gate pairs,
wherein said plurality of spare bit line pairs are connected to the first group of data line pairs by way of the first group of spare transfer gate pairs whose conductivity are controlled by said first spare column select line, and said plurality of spare bit line pairs are connected to the second group of data line pairs by way of the second group of spare transfer gate pairs whose conductivity are controlled by said second spare column select line.

* * * * *